(12) United States Patent
Kim et al.

(10) Patent No.: US 11,615,744 B2
(45) Date of Patent: Mar. 28, 2023

(54) DISPLAY DEVICE

(71) Applicant: Samsung Display Co., Ltd., Yongin-Si (KR)

(72) Inventors: Keun Woo Kim, Seongnam-si (KR); Tae Wook Kang, Seongnam-si (KR); Doo Na Kim, Seongnam-si (KR); Han Bit Kim, Seoul (KR); Jae Seob Lee, Seoul (KR); Jae Hwan Chu, Hwaseong-si (KR)

(73) Assignee: Samsung Display Co., Ltd.

( * ) Notice: Subject to any disclaimer, the term of this patent is extended or adjusted under 35 U.S.C. 154(b) by 6 days.

(21) Appl. No.: 17/141,808

(22) Filed: Jan. 5, 2021

(65) Prior Publication Data

US 2021/0304672 A1    Sep. 30, 2021

(30) Foreign Application Priority Data

Mar. 24, 2020   (KR) .......................... 10-2020-0035643

(51) Int. Cl.
   *G09G 3/3233*   (2016.01)
   *H01L 27/32*   (2006.01)
   *H01L 29/786*   (2006.01)

(52) U.S. Cl.
   CPC ....... *G09G 3/3233* (2013.01); *H01L 27/3262* (2013.01); *H01L 29/78696* (2013.01); *G09G 2300/043* (2013.01); *G09G 2300/0426* (2013.01); *G09G 2300/0809* (2013.01); *G09G 2320/0233* (2013.01)

(58) Field of Classification Search
   CPC ......... G09G 3/3233; G09G 2300/0426; G09G 2300/043; G09G 2300/0809; G09G 2320/0233; H01L 27/3262; H01L 29/78696
   See application file for complete search history.

(56) References Cited

U.S. PATENT DOCUMENTS 10,984,725 B1 *   4/2021   He .......................... H01L 27/127
2001/0035849 A1 *  11/2001  Kimura ................ G09G 3/3266
                                                           345/76

(Continued)

FOREIGN PATENT DOCUMENTS

KR   10-2014-0136783 A    12/2014
KR      10-1617202 B1      5/2016

(Continued)

*Primary Examiner* — Patrick N Edouard
*Assistant Examiner* — Eboni N Giles
(74) *Attorney, Agent, or Firm* — Innovation Counsel LLP

(57) ABSTRACT

Provided is a display device. The display device comprises a substrate, and a plurality of sub-pixels disposed on the substrate and including a light emitting element and a sub-pixel circuit driving the light emitting element. The sub-pixel circuit comprises a driving transistor controlling a driving current flowing through the light emitting element, a first transistor and a second transistor connected in series between a first node, which is a drain electrode of the driving transistor, and a second node, which is a gate electrode of the driving transistor, to receive the same scan signal, and a gate auxiliary electrode disposed on a gate electrode of the first transistor or the second transistor. The gate auxiliary electrode is connected to the gate electrode of the first transistor or the second transistor.

20 Claims, 16 Drawing Sheets

ACTL: ACT3, DT-ACT, ACT5
GTL1: G3, DT-G, G5, CE11
GTL2: VDDL1, CE12
SDL: DL, BE1, BE4, VDDL2

(56) References Cited

U.S. PATENT DOCUMENTS

| | | | |
|---|---|---|---|
| 2014/0346604 A1* | 11/2014 | Lee | H01L 29/78696 |
| | | | 257/365 |
| 2018/0151650 A1* | 5/2018 | Ha | H01L 29/78696 |
| 2020/0235193 A1* | 7/2020 | Tokuda | H01L 27/3258 |
| 2021/0057502 A1 | 2/2021 | Kim et al. | |

FOREIGN PATENT DOCUMENTS

| | | |
|---|---|---|
| KR | 10-2016-0098650 A | 8/2016 |
| KR | 10-2018-0061860 A | 6/2018 |
| KR | 10-2021-0022807 A | 3/2021 |

* cited by examiner

DISPLAY DEVICE

CROSS-REFERENCE TO RELATED APPLICATION

This application claims priority to and benefit of Korean Patent Application No. 10-2020-0035643, filed on Mar. 24, 2020, in the Korean Intellectual Property Office, and all the benefits accruing therefrom under 35 U.S.C. 119, the contents of which in its entirety are herein incorporated by reference.

BACKGROUND

1. Field

The present disclosure relates to a display device, and more particularly, to a display device in which an electric field formed at a floating source/drain node of a dual transistor disposed between a source electrode and a gate electrode of a driving transistor.

2. Description of the Related Art

Since the beginning of Information Age, demand for display devices for displaying images have been steadily increasing in various forms. Display devices are incorporated into various electronic appliances such as smart phones, digital cameras, notebook computers, navigators, and smart televisions. A display device may be a flat panel display device such as a liquid crystal display device, a field emission display device, or a light emitting display device. Since the light emitting display device, among flat panel display devices, includes light emitting elements by which each of the pixels in a display panel emits light by itself, it may display an image without a backlight unit providing light to the display panel.

Each of the pixels in the display panel may include a plurality of thin film transistors. Each of the plurality of thin film transistors may be turned on based on a signal applied to a gate electrode. However, when the thin film transistor is switched from a turn-on state to a turn-off state, leakage current may flow by an electric field between the channel region and source/drain region of the thin film transistor, and the leakage current may deteriorate the luminance of a pixel. Therefore, a novel display device to reduce leakage current flowing through a thin film transistor is desired to prevent deterioration of the luminance of a pixel.

SUMMARY

Aspects of the present disclosure are to provide a display device in which an electric field formed at a floating source/drain node of a dual transistor disposed between a source electrode and a gate electrode of a driving transistor, thereby reducing leakage current flowing through the dual transistor and preventing a drop in luminance of sub-pixels.

However, aspects of the present disclosure are not restricted to the one set forth herein. The above and other aspects of the present disclosure will become more apparent to one of ordinary skill in the art to which the present disclosure pertains by referencing the detailed description of the present disclosure given below.

According to an embodiment of the present disclosure, a display device comprises: a substrate, and a plurality of sub-pixels disposed on the substrate and including a light emitting element and a sub-pixel circuit which drives the light emitting element. The sub-pixel circuit comprises: a driving transistor controlling a driving current flowing through the light emitting element, a first transistor and a second transistor connected in series and disposed between a first node, which is a drain electrode of the driving transistor, and a second node, which is a gate electrode of the driving transistor, to receive a same scan signal from a same scan line, and a gate auxiliary electrode disposed on a gate electrode of the first transistor or the second transistor. The gate auxiliary electrode is connected to the gate electrode of the first transistor or the second transistor.

The gate auxiliary electrode may overlap a source electrode or a drain electrode of the first transistor or second transistor disposed between an active area of the first transistor and an active area of the second transistor in a thickness direction.

The display device may further comprise: an active layer disposed on the substrate, and a first gate layer disposed on the active layer. An active area of each of the driving transistor, the first transistor, and the second transistor may be disposed in the active layer. A gate electrode of each of the driving transistor, the first transistor, and the second transistor may be disposed in the first gate layer.

The display device may further comprise a second gate layer disposed on the first gate layer. The gate auxiliary electrode may be disposed in the second gate layer.

The display device may further comprise: a gate insulating film insulating the gate electrode of each of the first and second transistors and the active area of each of the first and second transistors, and an interlayer insulating film disposed between the first gate layer and the second gate layer and including at least one contact hole. The gate auxiliary electrode may be connected to the gate electrode of the first transistor or the second transistor through the contact hole of the interlayer insulating film.

The first transistor may include a source electrode connected to the first node and a drain electrode connected to the second transistor. The second transistor may include a source electrode connected to the drain electrode of the first transistor and a drain electrode connected to the second node.

The gate auxiliary electrode may overlap the drain electrode of the first transistor or the source electrode of the second transistor in a thickness direction.

The first transistor may further include a first doped area disposed between the active area of the first transistor and the source electrode of the first transistor, and a second doped area disposed between the active area of the first transistor and the drain electrode of the first transistor. The second transistor may further include a third doped area disposed between the active area of the second transistor and the source electrode of the second transistor, and a fourth doped area disposed between the active area of the second transistor and the drain electrode of the second transistor.

Doping concentration of each of the first, second, third, and fourth doped areas may be higher than doping concentration of the active area of the first transistor or the second transistor.

Doping concentration of each of the first, second, third, and fourth doped areas may be lower than doping concentration of each of the source electrode and drain electrode of the first transistor and the source electrode and drain electrode of the second transistor.

The gate auxiliary electrode may overlap the second doped area of the first transistor or the third doped area of the second transistor in a thickness direction.

The gate auxiliary electrode may overlap at least one of the second doped area and drain electrode of the first transistor and the third doped area and source electrode of the second transistor in a thickness direction.

The sub-pixel circuit may further comprise a third transistor selectively supplying a data voltage to a third node which is a source electrode of the driving transistor. The first, second, and third transistors may receive the same scan signal.

According to an embodiment of the present disclosure, a display device comprises: a substrate, and a plurality of sub-pixels disposed on the substrate and including a light emitting element and a sub-pixel circuit which drives the light emitting element. The sub-pixel circuit comprises: a driving transistor controlling a driving current flowing through the light emitting element, a first transistor including a first electrode connected to a first node, which is a drain electrode of the driving transistor, and a second electrode selectively connected to a second node, which is a gate electrode of the driving transistor, a second transistor including a first electrode connected to the second electrode of the first transistor and a second electrode connected to the second node, and a gate auxiliary electrode disposed on a gate electrode of the first transistor or the second transistor and overlapping the second electrode of the first transistor or the first electrode of the second transistor in a thickness direction. The gate auxiliary electrode is connected to the gate electrode of the first transistor or the second transistor.

The display device may further comprise: an active layer disposed on the substrate, and a first gate layer disposed on the active layer. An active area of each of the driving transistor, the first transistor, and the second transistor may be disposed in the active layer. A gate electrode of each of the driving transistor, the first transistor, and the second transistor may be disposed in the first gate layer.

The display device may further comprise a second gate layer disposed on the first gate layer. The gate auxiliary electrode may be disposed in the second gate layer.

The display device may further comprise: a gate insulating film insulating the gate electrode of each of the first and second transistors and the active area of each of the first and second transistors, and an interlayer insulating film disposed between the first gate layer and the second gate layer and including at least one contact hole. The gate auxiliary electrode may be connected to the gate electrode of the first transistor or the second transistor through the contact hole of the interlayer insulating film.

The first transistor may further include a first doped area disposed between the active area of the first transistor and the first electrode of the first transistor, and a second doped area disposed between the active area of the first transistor and the second electrode of the first transistor. The second transistor may further include a third doped area disposed between the active area of the second transistor and the first electrode of the second transistor, and a fourth doped area disposed between the active area of the second transistor and the second electrode of the second transistor.

The gate auxiliary electrode may overlap the second doped area of the first transistor or the third doped area of the second transistor in a thickness direction.

The gate auxiliary electrode may overlap at least one of the second doped area and second electrode of the first transistor and the third doped area and first electrode of the second transistor in a thickness direction.

BRIEF DESCRIPTION OF THE DRAWINGS

The above and other aspects and features of the present disclosure will become more apparent by describing in detail example embodiments thereof with reference to the attached drawings, in which.

DETAILED DESCRIPTION OF THE EMBODIMENTS

Figure 1:
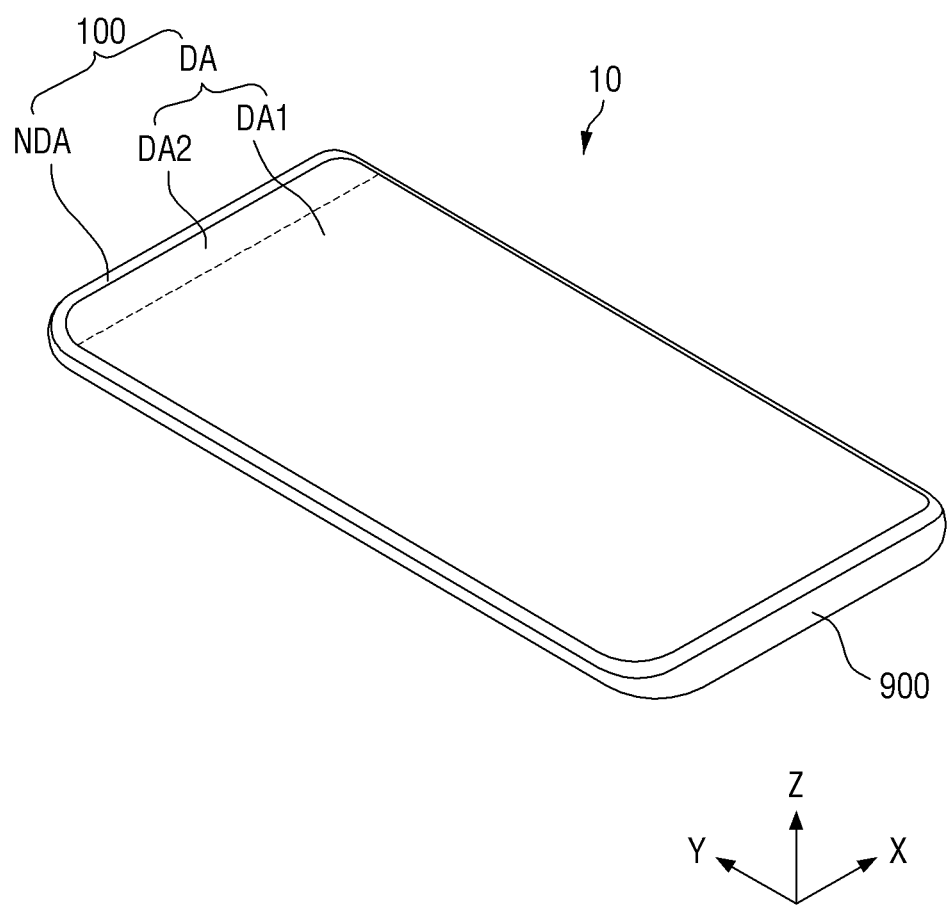
FIG. 1 is a perspective view of a display device according to an embodiment.

In the following description, for the purposes of explanation, numerous specific details are set forth in order to provide a thorough understanding of various example embodiments or implementations of the present disclosure. As used herein "embodiments" and "implementations" are interchangeable words that are non-limiting examples of devices or methods employing one or more of the inventive concepts disclosed herein. It is apparent, however, that various example embodiments may be practiced without these specific details or with one or more equivalent arrangements. In other instances, well-known structures and devices are shown in block diagram form in order to avoid unnecessarily obscuring various example embodiments. Further, various example embodiments may be different, but do not have to be exclusive. For example, specific shapes, configurations, and characteristics of an example embodiment may be used or implemented in another example embodiment without departing from the inventive concepts.

Unless otherwise specified, the illustrated example embodiments are to be understood as providing example features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an example embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the X-axis, the Y-axis, and the Z-axis are not limited to three axes of a rectangular coordinate system, such as the x, y, and z axes, and may be interpreted in a broader sense. For example, the X-axis, the Y-axis, and the Z-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the example term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various example embodiments are described herein with reference to sectional and/or exploded illustrations that are schematic illustrations of idealized example embodiments and/or intermediate structures. As such, variations from the shapes of the illustrations as a result, for example, of manufacturing techniques and/or tolerances, are to be expected. Thus, example embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

As customary in the field, some example embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some example embodiments may be physically separated into two or more interacting and discrete blocks, units, and/or modules without departing from the scope of the inventive concepts. Further, the blocks, units, and/or modules of some example embodiments may be physically combined into more complex blocks, units, and/or modules without departing from the scope of the inventive concepts.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Figure 2:
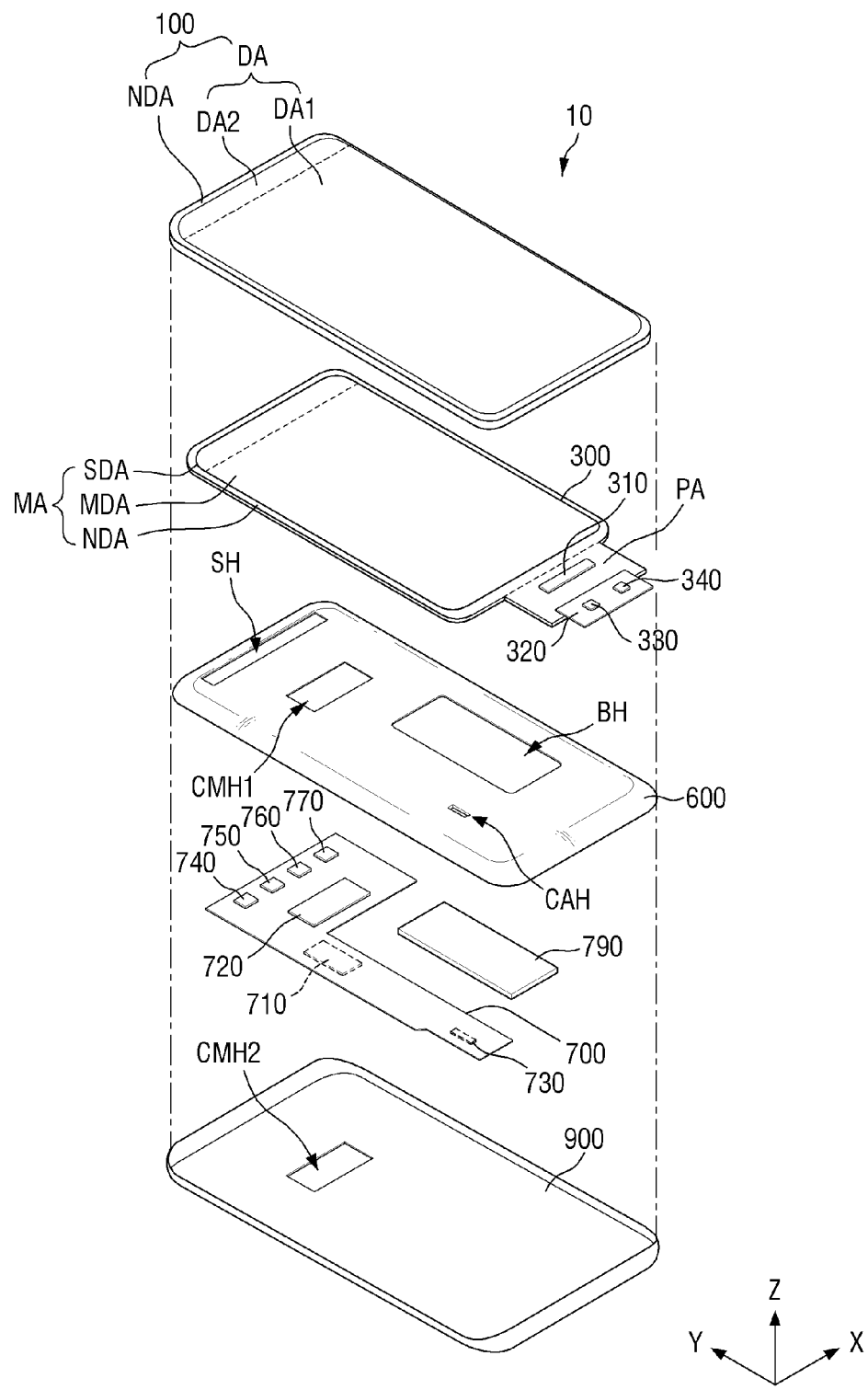
FIG. 2 is an exploded perspective view of a display device according to an embodiment.

FIG. 1 is a perspective view of a display device according to an embodiment, and FIG. 2 is an exploded perspective view of a display device according to an embodiment.

Referring to FIGS. 1 and 2, a display device 10 according to an embodiment includes a cover window 100, a display panel 300, a bracket 600, a main circuit board 700, and a lower cover 900.

In this specification, the "on", "over", "top", "upper side", or "upper surface" refers to an upward direction with respect to the display device, that is, a Z-axis direction, 10, and the "beneath", "under", "bottom", "lower side", or "lower surface" refers to a downward direction with respect to the display device 10, that is, a direction opposite to the Z-axis direction. Further, "left", "right", "upper", and "lower" refer to directions when the display device 10 is viewed in a plan view. For example, "left" refers to a direction opposite to the X-axis direction, "right" refers to the X-axis direction, "upper" refers to the Z-axis direction, and "lower" refers to a direction opposite to the Z-axis direction.

The display device 10, which is a device for displaying a moving image or a still image, may be used as a display screen of various products such as televisions, notebooks, monitors, billboards, internet of things (IOTs) as well as portable electronic appliances such as mobile phones, smart phones, tablet personal computers (tablet PCs), smart watches, watch phones, mobile communication terminals, electronic notebooks, electronic books, portable multimedia players (PMPs), navigators, and ultra mobile PCs (UMPCs).

The display device 10 may be formed in a rectangular shape viewed in a plan view. For example, the display device 10 may have a rectangular planar shape having short sides in the first direction (X-axis direction) and long sides in the second direction (Y-axis direction) as shown in FIGS. 1 and 2. The corner where the short side in the first direction (X-axis direction) meets the long side in the second direction (Y-axis direction) may be formed to have a right angle shape or a round shape having a predetermined curvature. The planar shape of the display device 10 is not limited to a rectangular shape, and may be formed in another polygonal shape, circular shape, or elliptical shape.

The cover window 100 may be disposed on the display panel 300 to cover the upper surface of the display panel 300. The cover window 100 may protect the upper surface of the display panel 300.

The cover window 100 may include a first light transmitting portion DA1 and a second light transmitting portion DA2 corresponding to the display panel 300, and a light blocking area LBA corresponding to an area other than the display panel 300. The second light transmitting portion DA2 may be disposed at one side of the first light transmitting portion DA1, for example, the upper side thereof as shown in FIGS. 1 and 2. The light blocking area LBA may be formed to be opaque. Alternatively, the light blocking area LBA may be formed as a decorative layer having a pattern that can be seen to a user when an image is not displayed.

The display panel 300 may be disposed under the cover window 100. Thus, the image of the display panel 300 may be seen from the upper surface of the display device 10 through the cover window 100.

The display panel 300 may be a light emitting display panel including a light emitting element. Examples of the display panel 300 may include an organic light emitting display panel using an organic light emitting diode including an organic light emitting layer, an ultra-micro light emitting diode display panel using an ultra-micro light emitting diode (ultra-micro LED, a quantum dot light emitting diode display panel using a quantum dot light emitting diode including a quantum dot light emitting layer, and an inorganic light emitting display panel using an inorganic light emitting diode including an inorganic semiconductor. Hereinafter, it is assumed that the display panel 300 is an organic light emitting display panel.

The display panel 300 may include a main area MA and a second non-display area PA protruding from one side of the main area MA.

The main area MA may include a first display area MDA, a second display area SDA, and a first non-display area NDA.

The first display area MDA may be disposed to overlap a first light transmitting portion DA1 of the cover window 100. The second display area SDA may be disposed to overlap a second light transmitting portion DA2 of the cover window 100. The second display area SDA may be disposed at one side of the first display area MDA, for example, the upper side thereof as shown in FIG. 2, but the present disclosure is not limited. As another example, the second display area SDA may be disposed to be surrounded by the first display area MDA, and may be disposed adjacent to the corners of the display panel 300. Although it is shown in FIG. 2 that the display panel 300 includes one second display area SDA, the present disclosure is not limited. For example, the display panel 300 may include a plurality of second display areas SDA.

Each of the first display area MDA and the second display area SDA may include a plurality of pixels, scan lines, data lines, and a power supply line. Each of the plurality of pixels includes a plurality of sub-pixels. The plurality of sub-pixels are connected to the scan lines, the data lines, and the power supply line.

The first non-display area NDA may be defined as an edge area of the display panel 300. The first non-display area NDA may include a scan driver for applying scan signals to the scan lines, and link lines connecting the data lines to a display driver 310.

The second non-display area PA may protrude from one side of the main area MA. As shown in FIG. 2, the second non-display area PA may protrude from the lower side of the first display area MDA. For example, the length of the second non-display area PA in the first direction (X-axis direction) may be smaller than the length of the main area MA in the first direction (X-axis direction).

The second non-display area PA may include a bending area and a pad area. In this case, the pad area may be disposed at one side of the bending area, and the main area MA may be disposed at the other side of the bending area. For example, the pad area may be disposed at the lower side of the bending area, and the main area MA may be disposed at the upper side of the bending area.

The display panel 300 may be flexibly formed to be curved, warped, bent, folded, or rolled. Therefore, the display panel 300 may be bent in the thickness direction (Z-axis direction) in the bending area.

The display panel 300 may include a display driver 310, a circuit board 320, a power supply unit 330, and a touch driver 340.

The display driver 310 may output signals and voltages for driving the display panel 300. For example, the display driver 310 may supply a data voltage to a data line. In addition, the display driver 310 may supply a power supply voltage to a power supply line, and may supply a scan control signal to a scan driver.

The circuit board 320 may be attached onto the pad using an anisotropic conductive film (ACF). The lead lines of the circuit board 320 may be electrically connected to the pads of the display panel 300. For example, the circuit board 320 may be a flexible printed circuit board (FPCB), a printed circuit board (PCB), or a flexible film such as a chip on film (COF).

The power supply unit 330 may be disposed on the circuit board 320 to supply driving voltages to the display driver 310 and the display panel 300. Specifically, the power supply unit 330 may generate a first driving voltage and supply the first driving voltage to a first driving voltage line, and may generate a second driving voltage and supply the second driving voltage to a second driving voltage line. Further, the power supply unit 330 may generate a third driving voltage and supply the third driving voltage to a cathode electrode of an organic light emitting diode of each of the first and second sub-pixels. For example, the first and second driving voltages may be high-potential voltages for driving a light emitting element, for example, an organic light emitting diode, and the second driving voltage may be a high-potential voltage greater than the first driving voltage. The third driving voltage may be a low-potential voltage for driving the organic light emitting diode.

The touch driver 340 may be disposed on the circuit board 320 to measure capacitances of touch electrodes. For example, the touch driver 340 may determine a user's touch and a user's touch position on the basis of the change in capacitance of the touch electrodes. Here, the user's touch means that an object such as a user's finger or pen directly contacts one surface of the display device 10 disposed on s touch sensing layer. The touch driver 340 may determine the user's touch position by distinguishing a portion where a user touch occurs from a portion where the user touch does not occur among the plurality of touch electrodes.

The bracket 600 may be disposed under the display panel 300. A first camera hole CMH1 into which a first camera sensor 720 is inserted is defined in the bracket 600. A battery hole BH in which a battery is disposed, and a cable hole CAH through which a cable connected to the display driver 310 or the circuit board 320 passes, and a sensor hole SH in which sensor devices 740, 750, 760, and 770 are disposed are also defined in the bracket 600. As another example, instead of including the sensor hole SH, the bracket 600 may be formed so as not to overlap the second display area SDA of the display panel 300.

The main circuit board 700 and a battery 790 may be disposed under the bracket 600. The main circuit board 700 may be a printed circuit board or a flexible printed circuit board.

The main circuit board 700 may include a main processor 710, a first camera sensor 720, a main connector 730, and a plurality of sensor devices 740, 750, 760, and 770. The first camera sensor 720 may be disposed on both the upper surface and lower surface of the main circuit board 700, the main processor 710 may be disposed on the upper surface of the main circuit board 700, and the main connector 730 may be disposed on the lower surface of the main circuit board 700. The plurality of sensor devices 740, 750, 760, 770 may be disposed on the upper surface of the main circuit board 700.

The main processor 710 may control all the functions of the display device 10. For example, the main processor 710 may output digital video data to the display driver 310 such that the display panel 300 displays an image. Further, the main processor 710 may receive touch data from the touch driver 340, determine the touch coordinates of a user, and then execute an application indicated by an icon displayed at the touch coordinates of the user.

The main processor 710 may control the display device 10 according to sensor signals input from the plurality of sensor devices 740, 750, 760, and 770. For example, the main processor 710 may determine whether an object is located close to the upper surface of the display device 10 according to a proximity sensor signal input from the proximity sensor 740. When the object is located close to the upper surface of the display device 10 in the call mode, the main processor 710 may not execute an application indicated by an icon displayed at the touch coordinates even if a touch is executed by a user.

The main processor 710 may determine the brightness of the upper surface of the display device 10 according to an illumination sensor signal input from the illumination sensor 750. The main processor 710 may adjust the luminance of an image displayed by the display panel 300 according to the brightness of the upper surface of the display device 10.

The main processor 710 may determine whether an iris image of the user is the same as the iris image previously stored in the memory according to an iris sensor signal input from the iris sensor 760. When the iris image of the user is the same as the iris image previously stored in the memory, the main processor 710 may unlock the display device 10 and display a home screen on the display panel 300.

The first camera sensor 720 may process an image frame such as a still image or a moving image obtained by the image sensor, and output the processed image frame to the main processor 710. For example, the first camera sensor 720 may be a CMOS image sensor or a CCD sensor, but is not necessarily limited. The first camera sensor 720 may be exposed to the lower surface of the lower cover 900 by the second camera hole CMH2, and may photograph an object or a background disposed under the display device 10.

The cable having passed through the cable hole CAH of the bracket 600 may be connected to the main connector 730. Thus, the main circuit board 700 may be electrically connected to the display driver 310 or the circuit board 320.

The plurality of sensor devices may include a proximity sensor 740, an illumination sensor 750, an iris sensor 760, and a second camera sensor 770.

The proximity sensor 740 may detect whether an object is located close to the upper surface of the display device 10. For example, the proximity sensor 740 may include a light source that outputs light and a light receiver that receives light reflected by the object. The proximity sensor 740 may determine whether an object located close to the upper surface of the display device 10 exists according to the amount of light reflected by the object. Since the proximity sensor 740 is disposed to overlap the sensor hole SH, the second display area SDA of the display panel 300, and the second light transmitting portion DA2 of the cover window 100 in the thickness direction (Z-axis direction) of the display panel 300, the proximity sensor 740 may generate a proximity sensor signal depending on whether the object located close to the upper surface of the display device 10 exists, and may output the proximity signal to the main processor 710.

The illumination sensor 750 may detect the brightness of the upper surface of the display device. The illumination sensor 750 may include a resistor whose resistance value changes depending on the brightness of incident light. The illumination sensor 750 may determine the brightness of the upper surface of the display device depending on the resistance value of the resistor. Since the illumination sensor 750 is disposed to overlap the sensor hole SH, the second display area SDA of the display panel 300, and the second light transmitting portion DA2 of the cover window 100 in the thickness direction (Z-axis direction) of the display panel 300, the illumination sensor 750 may generate an illumination sensor signal depending on the brightness of the upper surface of the display device, and may output the illumination sensor signal to the main processor 710.

The iris sensor 760 may detect whether an image of a user's iris is the same as the iris image previously stored in the memory. The iris sensor 760 may generate an iris sensor signal depending on whether the image of the user's iris is the same as the iris image previously stored in the memory, and may generate the iris sensor signal to the main processor 710.

The second camera sensor 770 may process an image frame such as a still image or a moving image obtained by the image sensor, and output the processed image frame to the main processor 710. For example, the second camera sensor 770 may be a CMOS image sensor or a CCD sensor, but is not necessarily limited. The number of pixels in the second camera sensor 770 may be smaller than the number of pixels in the first camera sensor 720, and the size of the second camera sensor 770 may be smaller than the size of the first camera sensor 720. Since the second camera sensor 770 is disposed to overlap the sensor hole SH, the second display area SDA of the display panel 300, and the second light transmitting portion DA2 of the cover window 100 in the thickness direction (Z-axis direction) of the display panel 300, the second camera sensor 770 may photograph an object or a background disposed on the display device 10.

The battery 790 may be disposed not to overlap the main circuit board 700 in the third direction (Z-axis direction). That is, the battery 790 is aligned with the battery hole BH of the bracket 600 so that the battery 790 may overlap the battery hole BH of the bracket 600.

The main circuit board 700 may include a mobile communication module capable of transmitting and receiving a radio signal to/from at least one of a base station, an external terminal, and a server. The radio signal may include various types of data depending on a voice signal, a video call signal, or a text/multimedia message transmission/reception.

The lower cover 900 may be disposed under the main circuit board 700 and the battery 790. The lower cover 900 may be fixedly engaged to the bracket 600. The lower cover 900 may form a lower surface appearance of the display device 10. The lower cover 900 may be made of plastic, metal, or a combination of plastic and metal.

A second camera hole CMH2 through which the lower surface of the first camera sensor 720 is exposed is defined in the lower cover 900. The position of the first camera sensor 720 and the positions of the first and second camera holes CMH1 and CMH2 corresponding to the first camera sensor 720 are limited to the embodiment shown in FIG. 2.

Figure 3:
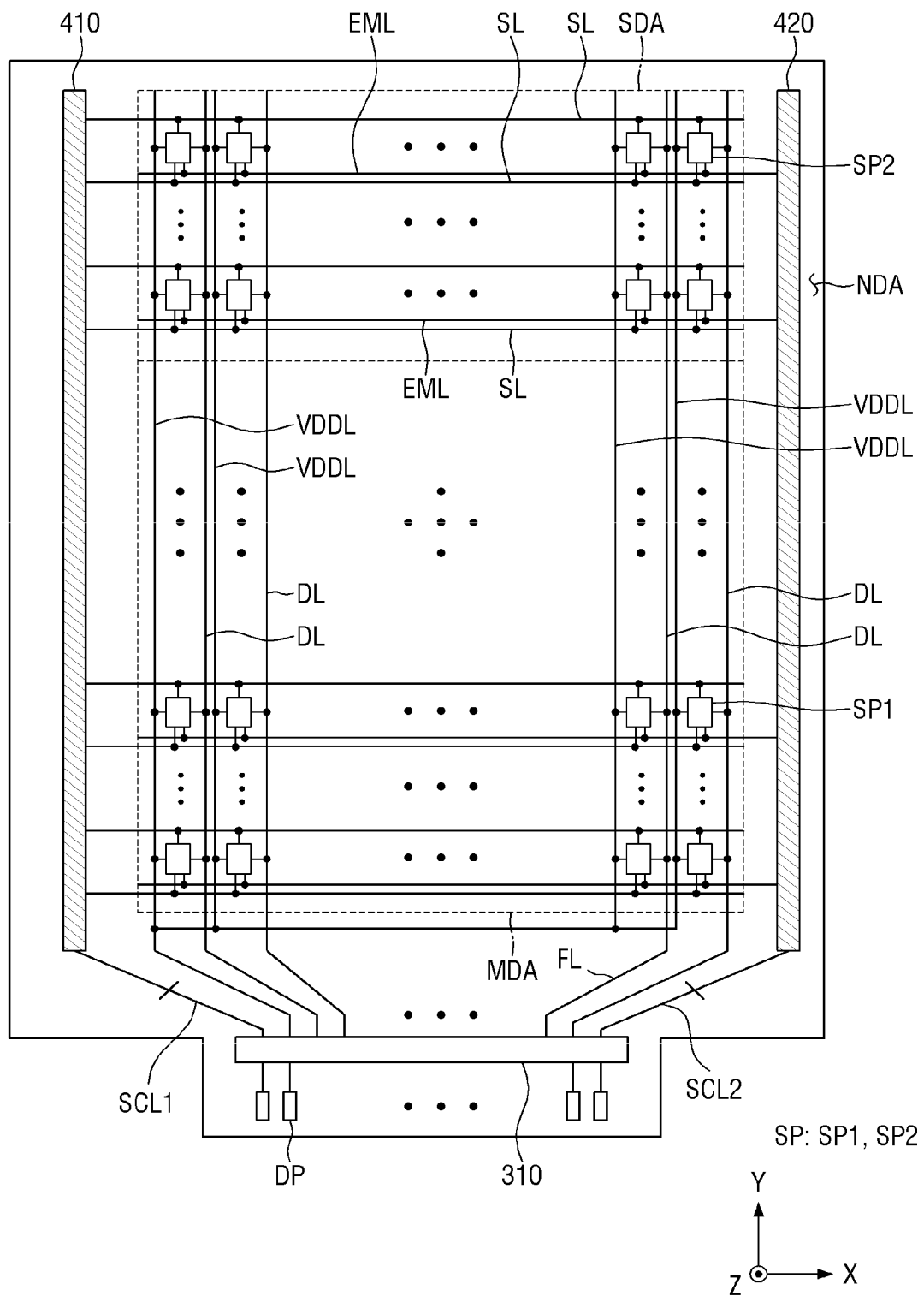
FIG. 3 is a plan view of a display panel according to an embodiment.
Figure 4:
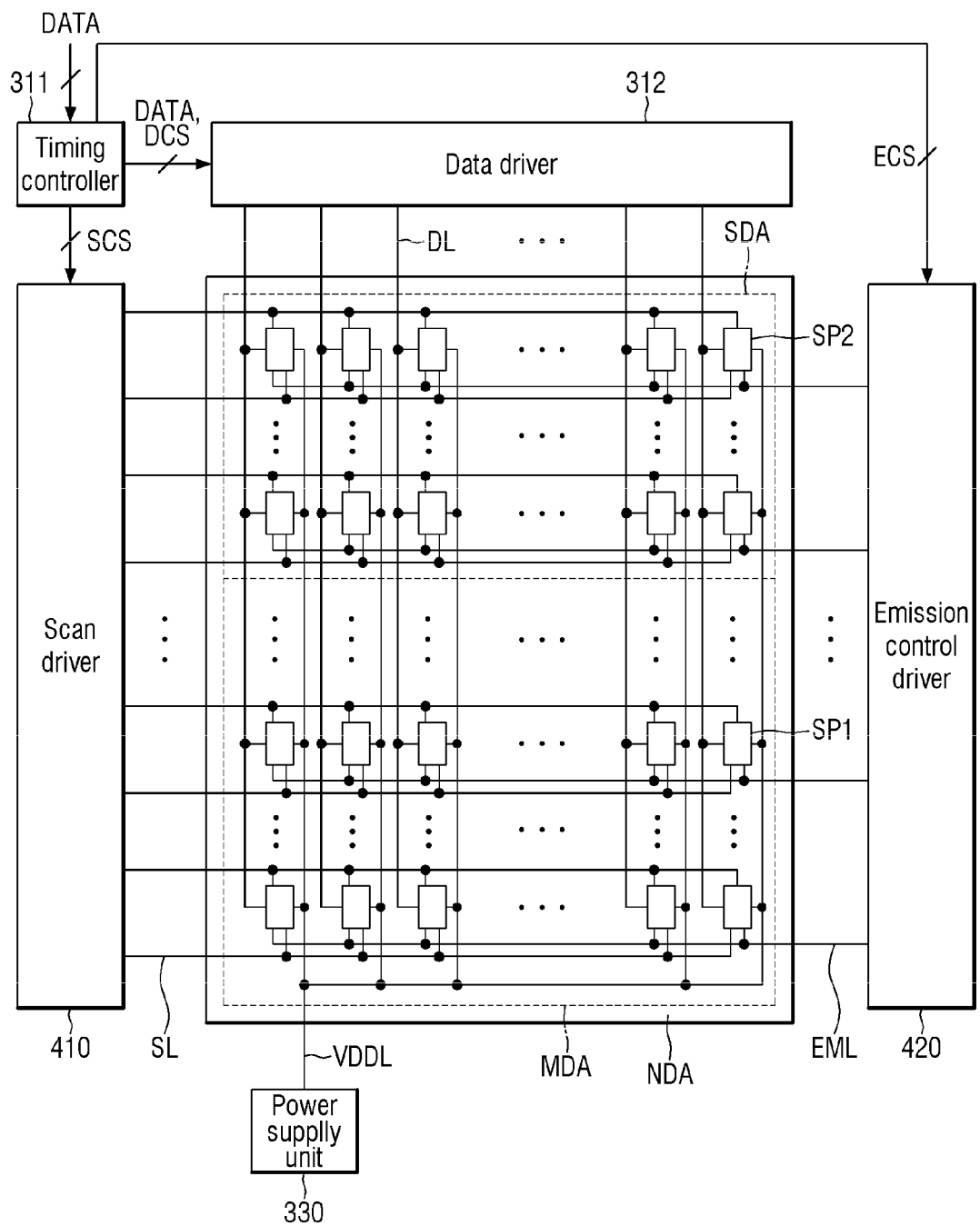
FIG. 4 is a block diagram illustrating a display panel and a display driver according to an embodiment.

FIG. 3 is a plan view of a display panel according to an embodiment, and FIG. 4 is a block diagram illustrating a display panel and a display driver according to an embodiment.

Referring to FIGS. 3 and 4, the display panel 300 may include a first display area MDA, a second display area SDA, and a first non-display area NDA.

The first display area MDA includes a plurality of first sub-pixels SP1, driving voltage lines VDDL connected to the plurality of first sub-pixels SP1, scan lines SL, and emission control lines EML, and data lines DL.

Each of the plurality of first sub-pixels SP1 may be connected to at least one scan line SL, at least one data line DL, at least one emission control line EML, and at least one driving voltage line VDDL. Although it is shown in FIGS. 3 and 4 that each of the plurality of first sub-pixels SP1 may be connected to two scan lines SL, one data line DL, one emission control line EML, and one driving voltage line VDDL, the present disclosure is not limited. For example, each of the plurality of first sub-pixels SP1 may be connected to three or more scan lines SL.

Each of the plurality of first sub-pixels SP1 may include a driving transistor, at least one switching transistor, a light emitting element, and a capacitor.

The first sub-pixels SP1 may receive a driving voltage VDD through driving voltage line VDDL. Here, the driving voltage VDD may be a high-potential voltage for driving the light emitting elements of the plurality of first sub-pixels SP1.

The scan lines SL and the emission control lines EML may extend in the first direction (X-axis direction), and may be spaced apart from each other in the second direction (Y-axis direction) crossing the first direction (X-axis direction).

The data lines DL and the driving voltage lines VDDL may extend in the second direction (Y-axis direction), and may be spaced apart from each other in the first direction (X-axis direction).

The second display area SDA may include second sub-pixels SP2, driving voltage lines VDDL connected to the plurality of second sub-pixels SP2, scan lines SL, and emission control lines EML, and data lines DL.

Each of the plurality of second sub-pixels SP2 may be connected to at least one scan line SL, at least one data line DL, at least one emission control line EML, and at least one driving voltage line VDDL. Although it is shown in FIGS. 3 and 4 that each of the plurality of second sub-pixels SP2 may be connected to two scan lines SL, one data line DL, one emission control line EML, and one driving voltage line VDDL, the present disclosure is not limited. For example, each of the second sub-pixels SP2 may be connected to three or more scan lines SL.

Each of the second sub-pixels SP2 may include a driving transistor, at least one switching transistor, a light emitting element, and a capacitor.

The second sub-pixels SP2 may receive a driving voltage VDD through the driving voltage lines VDDL. Here, the driving voltage VDD may be a high-potential voltage for driving the light emitting elements of the second sub-pixels SP2.

For example, the number of first sub-pixels SP1 per unit area of the first display area MDA may be larger than the number of second sub-pixels SP2 per unit area of the second display area SDA. The first display area MDA is an area for displaying an image, which is a main function of the display device 10, and the first sub-pixels SP1 may be densely arranged in the first display area MDA. The second display area SDA may include a pixel area in which the second sub-pixels SP2 are arranged, and a transmission area that transmits light. Accordingly, as the area of the transmission area of the second display area SDA increases, the number of second sub pixels SP2 per unit area may be smaller than the number of first sub pixels SP1 per unit area.

The first non-display area NDA may be defined as a remaining area of the display panel 300 that is not part of the first display area MDA or the second display area SDA. The first non-display area may include a scan driver 410 for applying scan signals to the scan lines SL, an emission control driver 420 for applying emission signals to the emission control lines EML, fan-out lines FL for connecting the data lines DL and the display driver 310, and pads DP connected to the circuit board 320. The display driver 310 and the pads DP may be disposed in the pad area of the display panel 300. The pads DP may be disposed closer to one edge of the pad area than the display driver 310.

As shown in FIG. 4, the display driver 310 may include a timing controller 311 and a data driver 312.

The timing controller 311 may receive digital video data DATA and timing signals from the circuit board 320. The timing controller 311 may generate a scan control signal SCS on the basis of the timing signals to control the operation timing of the scan driver 410, may generate an emission control signal ECS on the basis of the timing signals to control the operation timing of the emission control driver 420, and may generate a data control signal DCS on the basis of the timing signals to control the operation timing of the data driver 312. The timing controller 311 may output the scan control signal SCS to the scan driver 410 through the first scan control line SCL1. The timing controller 311 may output the emission control signal ECS to the emission control driver 420 through the second scan control line SCL2. The timing controller 311 may supply the digital video data DATA and the data control signal DCS to the data driver 312.

The data driver 312 may convert the digital video data DATA into analog data voltages and output the analog data voltages to the data lines DL through the fan-out lines FL. The scan signals of the scan driver 410 may select pixels SP to which the data voltage is to be supplied, and the data driver 312 may supply the data voltages to the selected pixels SP. "Pixels SP," as used herein, is intended to mean either the first sub-pixel SP1 or the second sub-pixel SP2.

As shown in FIG. 3, the scan driver 410 may be disposed outside one side of the first display area MDA and one side of the second display area SDA or at one side of the first non-display area NDA. The emission control driver 420 may be disposed outside the other side of the first display area MDA and the other side of the second display area SDA or at the other side of the first non-display area NDA. As another example, both the scan driver 410 and the emission control driver 420 may be disposed outside one side of the first display area MDA and one side of the second display area SDA.

The scan driver 410 may include a plurality of thin film transistors for generating scan signals based on the scan control signal SCS, and the emission control driver 420 may include a plurality of thin film transistors for generating emission signals based on the emission control signal ECS. For example, the thin film transistors of the scan driver 410 and the thin film transistors of the emission control driver 420 may be formed on the same layer as the thin film transistors of the first and second sub-pixels SP1 and SP2, respectively.

Figure 5:
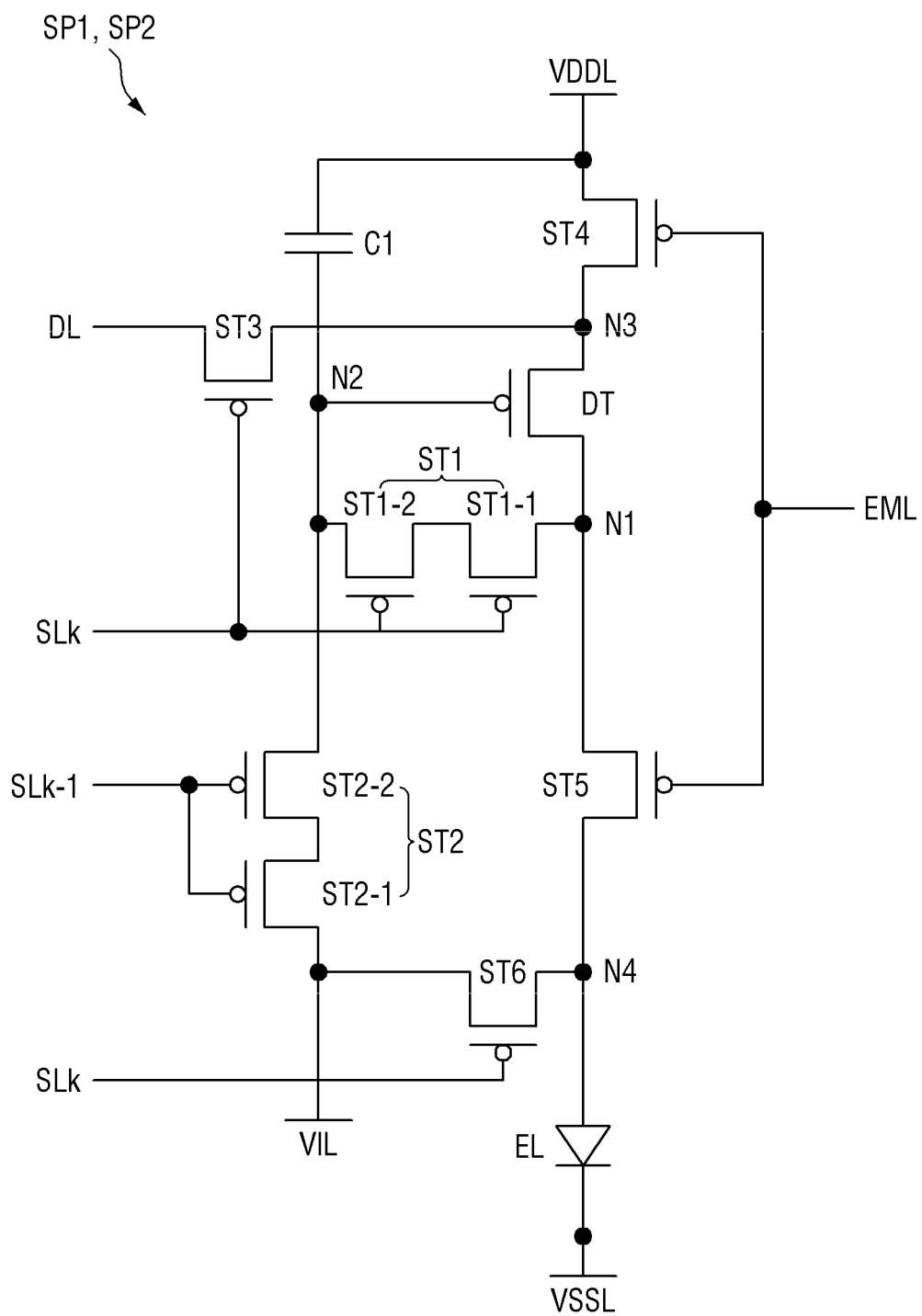
FIG. 5 depicts a sub-pixel circuit of a sub-pixel according to an embodiment.
Figure 6:
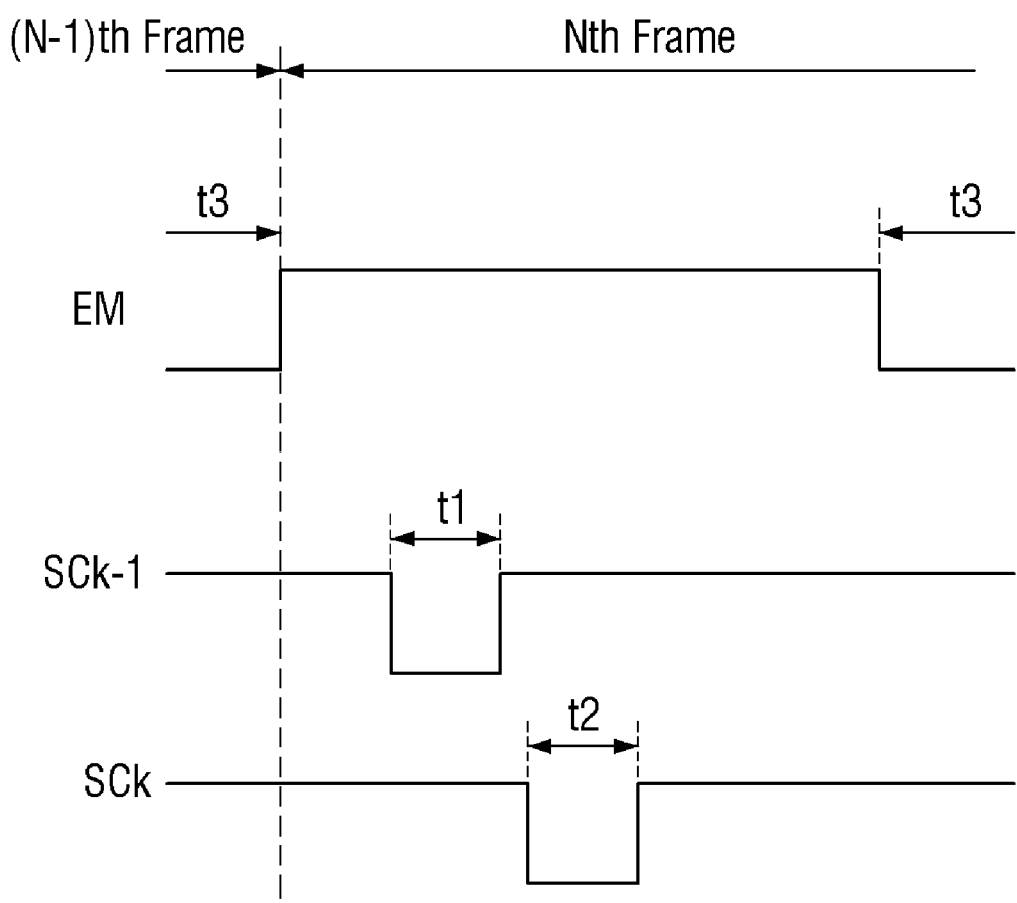
FIG. 6 is a waveform diagram of signals transmitted to the sub-pixel illustrated in FIG. 5.

FIG. 5 depicts a sub-pixel circuit of a sub-pixel according to an embodiment, and FIG. 6 is a waveform diagram of signals transmitted to the sub-pixel illustrated in FIG. 5. Here, the sub-pixel SP illustrated in FIG. 5 may correspond to the first sub-pixel SP1 or the second sub-pixel SP2 illustrated in FIGS. 3 and 4.

Referring to FIGS. 5 and 6, the display panel 300 may include a plurality of sub-pixels SP arranged along a k-th row (k is a natural number) and a j-th column (j is a natural number). For example, the first display area MDA of the display panel 300 may include first sub-pixels SP1, and the second display area SDA thereof may include second sub-pixels SP2. The first sub-pixels SP1 or the second sub-pixels SP2 arranged in the k-th row may be connected to the k-th scan line SLk, the k-lth scan line SLk-1, the emission control line EML, the data line DL, the driving voltage line VDDL, and the initialization voltage line VIL.

Each of the first sub-pixels SP1 and each of the second sub-pixels SP2 may include a driving transistor DT, a light emitting element EL, a plurality of switching elements, and a first capacitor C1. The switching elements may include first to sixth transistors ST1, ST2, ST3, ST4, ST5, and ST6.

The driving transistor DT may include a gate electrode, a source electrode, and a drain electrode. The drain electrode of the driving transistor DT may be connected to a first node N1, the gate electrode of the driving transistor DT may be connected to a second node N2, and the source electrode of the driving transistor DT may be connected to a third node N3. The driving transistor DT controls a source-drain current Isd (hereinafter, referred to as "driving current") on the basis of the data voltage (hereinafter, indicated as "Vdata") applied to the gate electrode. The driving current Isd flowing through the channel of the driving transistor DT is proportional to a square of a difference between the gate-source voltage Vsg and the threshold voltage Vth of the first transistor T1 ($Isd=k'\times(Vsg-Vth)^2$). Here, k' refers to a proportional coefficient determined by the structure and physical characteristics of the driving transistor DT, Vsg refers to a source-gate voltage of the driving transistor DT, and Vth refers to a threshold voltage of driving transistor DT.

The light emitting element EL may receive the driving current Isd to emit light. The emission amount or luminance of the light emitting element EL may be proportional to the intensity of the driving current Isd.

The light emitting element EL may be an organic light emitting diode including an anode electrode, a cathode electrode, and an organic light emitting layer disposed between the anode electrode and the cathode electrode. Alternatively, the light emitting element EL may be an inorganic light emitting element including an anode electrode, a cathode electrode, and an inorganic semiconductor layer disposed between the anode electrode and the cathode electrode. Alternatively, the light emitting element EL may be a quantum dot light emitting element including an anode electrode, a cathode electrode, and a quantum dot light emitting layer disposed between the anode electrode and the cathode electrode. Alternatively, the light emitting element EL may be a micro light emitting diode.

An anode electrode of the light emitting element EL may be connected to a fourth node N4. The anode electrode of the light emitting element EL may be connected to a drain electrode of the fifth transistor ST5 and a drain electrode of the sixth transistor T6 through the fourth node N4. A cathode electrode of the light emitting element EL may be connected to a low-potential line VSSL. A parasitic capacitance may be formed between the anode electrode and cathode electrode of the light emitting element EL.

The first transistor ST1 may be turned on by a scan signal SCk of the scan line SLk of the corresponding stage to connect the first node N1, which is a drain electrode of the driving transistor DT, to the second node N2, which is a gate electrode of the driving transistor DT. For example, the first transistor ST1 may be a dual transistor including a first-first transistor ST1-1 and a first-second transistor ST1-2. The gate electrode of the first-first transistor ST1-1 may be connected to the scan line SLk of the corresponding stage, the source electrode of the first-first transistor ST1-1 may be connected to the first node N1, and the drain electrode of the first-first transistor ST1-1 may be connected to the source electrode of the first-second transistor ST1-2. The gate electrode of the first-second transistor ST1-2 may be connected to the scan line SLk of the corresponding stage, the source electrode of the first-second transistor ST1-2 may be connected to the drain electrode of the first-first transistor ST1-1, and the drain electrode of the first-second transistor ST1-2 may be connected to the second node N2.

The second transistor ST2 may be turned on by a scan signal SCk-1 of the scan line SLk-1 of the previous stage to connect the initialization voltage line VIL to the second node N2, which is a gate electrode of the driving transistor DT. For example, the second transistor ST2 may be a dual transistor including a second-first transistor ST2-1 and a second-second transistor ST2-2. The second-first transistor ST2-1 and the second-second transistor ST2-2 are turned on based on the scan signal SCk-1 of the previous stage to discharge the gate electrode of the driving transistor DT with the initialization voltage VI. The gate electrode of the second-first transistor ST2-1 may be connected to the scan line SLk of the previous stage, the source electrode of the second-first transistor ST2-1 may be connected to the initialization voltage line VIL, and the drain electrode of the second-first transistor ST2-1 may be connected to the source electrode of the second-second transistor ST2-2. The gate electrode of the second-second transistor ST2-2 may be connected to the scan line SLk-1 of the previous stage, the source electrode of the second-second transistor ST2-2 may be connected to the drain electrode of the second-first transistor ST2-1, and the drain electrode of the second-second transistor ST2-2 may be connected to the second node N2.

The third transistor ST3 may be turned on by a scan signal SCk of the scan line SLk of the corresponding stage to connect the data line DL to the third node N3, which is a source electrode of the driving transistor DT. The third transistor ST3 may be turned on based on the scan signal SCk to supply the data voltage Vdata to the third node N3. The gate electrode of the third transistor ST3 may be connected to the scan line SLk of the corresponding stage, the source electrode thereof may be connected to the data line DL, and the drain electrode thereof may be connected to the third node N3. The drain electrode of the third transistor ST3 may be connected to the source electrode of the driving transistor DT and the drain electrode of the fourth transistor ST4 through the third node N3.

The fourth transistor ST4 may be turned on by an emission signal EM of the emission control line to connect the driving voltage line DL to the third node N3, which is a source electrode of the driving transistor DT. The gate electrode of the fourth transistor ST4 may be connected to the emission control line EML, the source electrode of the fourth transistor ST4 may be connected to the driving voltage line VDDL, and the drain electrode of the fourth transistor ST4 may be connected to the third node N3. The drain electrode of the fourth transistor ST4 may be connected to the source electrode of the driving transistor DT and the drain electrode of the third transistor ST3 through the third node N3.

The fifth transistor ST5 may be turned on by the emission signal EM of the emission control line EML to connect the first node N1, which is a drain electrode of the driving transistor DT, to the fourth node N4, which is an anode electrode of the light emitting element EL. The gate electrode of the fifth transistor ST5 may be connected to the emission control line EML, the source electrode thereof may be connected to the first node N1, and the drain electrode of the fifth transistor ST5 may be connected to the fourth node N4. The source electrode of the fifth transistor ST5 may be connected to the drain electrode of the driving transistor DT and the source electrode of the first-first transistor ST1-1 through the first node N1. The drain electrode of the fifth transistor ST5 may be connected to the anode electrode of the light emitting element EL and the drain electrode of the sixth transistor ST6 through the fourth node N4.

When all of the fourth transistor ST4, the driving transistor DT, and the fifth transistor ST5 are turned on, the driving current may be supplied to the light emitting element EL.

The sixth transistor ST6 may be turned on by a scan signal SCk-1 of the scan line SLk of the corresponding stage to connect the initialization voltage line VIL to the fourth node N4, which is an anode electrode of the light emitting element EL. The sixth transistor ST6 may be turned on based on the scan signal SCk to discharge the anode electrode of the light emitting element EL with the initialization voltage VI. The gate electrode of the sixth transistor ST6 may be connected to the scan line SLk of the corresponding stage, the source electrode may be connected to the initialization voltage line VIL, and the drain electrode may be connected to the fourth node N4. The drain electrode of the sixth transistor ST6 may be connected to the anode electrode of the light emitting element EL and the drain electrode of the fifth transistor ST5 through the fourth node N4.

Each of the driving transistor DT and the first to sixth transistors ST1, ST2, ST3, ST4, ST5, and ST6 may include a silicon-based active layer. For example, each of the driving transistor DT and the first to sixth transistors ST1, ST2, ST3, ST4, ST5, and ST6 may include an active layer made of low-temperature polycrystalline silicon (LTPS). The active layer made of low-temperature polycrystalline silicon may have high electron mobility and excellent turn-on characteristics. Therefore, the display device 10 may stably and efficiently drive the plurality of sub-pixels SP by including the driving transistor DT and the first to sixth transistors ST1, ST2, ST3, ST4, ST5, and ST6 having excellent turn-on characteristics.

Each of the driving transistor DT and the first to sixth transistors ST1, ST2, ST3, ST4, ST5, and ST6 may correspond to a p-type transistor. For example, each of the driving transistor DT and the first to sixth transistors ST1, ST2, ST3, ST4, ST5, and ST6 may output a current flowing into the source electrode to the drain electrode based on a gate low voltage applied to the gate electrode.

The first capacitor C1 may be connectedly disposed between the second node N2, which is a gate electrode of the driving transistor DT, and the driving voltage line VDDL. For example, the first electrode of the first capacitor C1 may be connected to the second node N2, and the second electrode of the first capacitor C1 may be connected to the driving voltage line VDDL, thereby maintaining a potential difference between the driving voltage line VDDL and the gate electrode of the driving transistor DT.

Referring to FIG. 6 together with FIG. 5, the display device 10 may be driven through first to third periods t1, t2, and t3 of one frame. The second transistor ST2 may receive the scan signal SCk-1 of the previous stage at a low level during the first period t1 of the Nth frame (N is a natural number of 2 or more). The second transistor ST2 may be turned on based on the scan signal SCk-1 of a low level, and may supply the initialization voltage VI to the second node N2 which is a gate electrode of the driving transistor DT. Therefore, the second transistor ST2 may initialize the gate electrode of the driving transistor DT during the first period t1.

The first transistor ST1 may receive the scan signal SCk of the corresponding stage at a low level during the second period t2. The first transistor ST1 may be turned on based on the scan signal SCk of a low level, and may connect the first node N1 and the second node N2.

The third transistor ST3 may receive the scan signal SCk of the corresponding stage at a low level during the second period t2. The third transistor ST3 may be turned on based on the scan signal SCk of a low level, and may supply the data voltage Vdata to the third node N3 which is a source electrode of the driving transistor DT.

When the source electrode of the driving transistor DT receives the data voltage Vdata, the source-gate voltage Vsg of the driving transistor DT may correspond to a voltage difference Vdata-VI between the data voltage Vdata and the initialization voltage VI, and the source-gate voltage Vsg may become greater (Vdata−VI≥Vth) than the threshold voltage (hereinafter referred to as "Vth") to allow the driving transistor DT to be turned on. Therefore, the moment the driving transistor DT is turned on during the second period t2, the source-drain current Isd of the driving transistor DT may be determined based on the data voltage Vdata, the initialization voltage VI, and the threshold voltage Vth of the driving transistor DT (Isd=k'*(Vdata−VI−Vth)$^2$). The driving transistor DT may supply the source-drain current Isd to the first node N1 until the source-gate voltage Vsg reaches the threshold voltage Vth of the driving transistor DT. Further, the first transistor ST1 may be turned on during the second period t2 to supply the voltage of the first node N1 to the second node N2. In this way, while the driving transistor DT is turned on, the voltage of the second node N2 and the source-drain current Isd of the driving transistor DT may be changed, and the voltage of the second node N2 may converge to the voltage difference Vdata-Vth between the data voltage Vdata and the threshold voltage Vth of the driving transistor DT.

The sixth transistor ST6 may receive the scan signal SCk of the corresponding stage at a low level during the second period t2. The sixth transistor ST6 may be turned on based on the scan signal SCk of a low level, and may supply the initialization voltage VI to the fourth node N4 which is an anode electrode of the light emitting element EL. Accordingly, the sixth transistor ST6 may initialize the anode electrode of the light emitting element EL during the second period t2.

The emission signal EM may have a gate low voltage during the third period t3. When the emission signal EM has a low level, the fourth and fifth transistors ST4 and ST5 are turned on to supply a driving current to the light emitting element EL.

Figure 7:
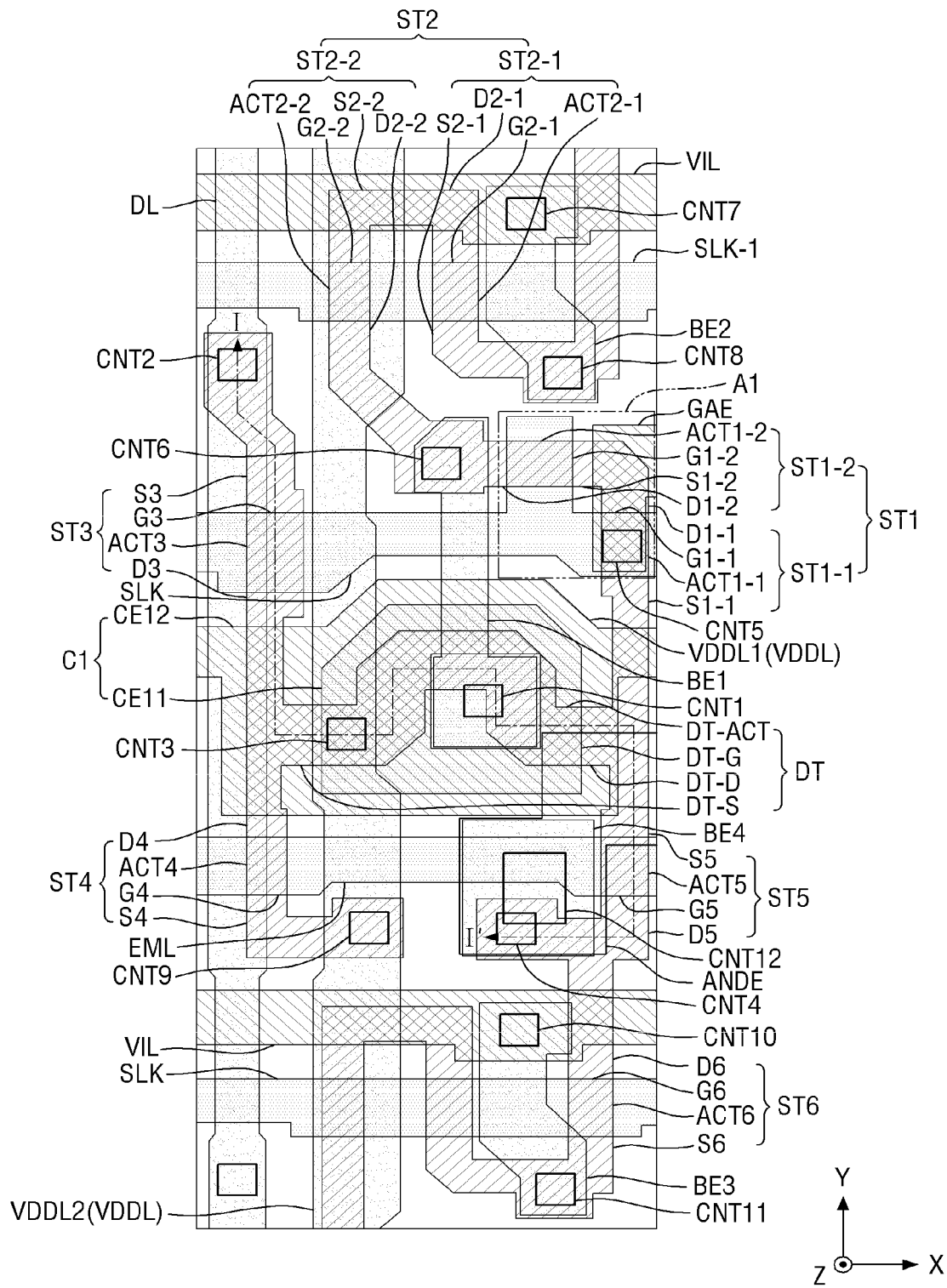
FIG. 7 is a plan view illustrating an example of the sub-pixel illustrated in FIG. 5.
Figure 8:
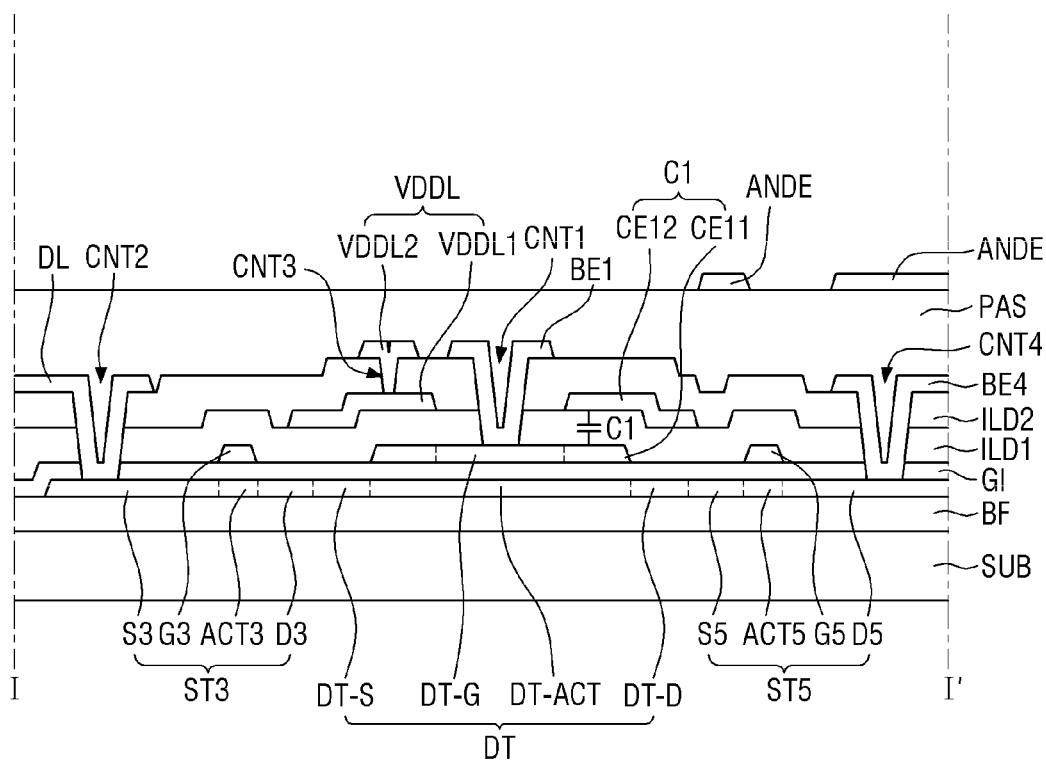
FIG. 8 is a cross-sectional view taken along line I-I' in FIG. 7.

FIG. 7 is a plan view illustrating an example of the sub-pixel illustrated in FIG. 5, and FIG. 8 is a cross-sectional view taken along line I-I' in FIG. 7.

Referring to FIGS. 7 and 8, each of the first sub-pixels SP1 of the first display area MDA and the second sub-pixels SP2 of the second display area SDA may include a driving transistor DT, a light emitting element EL, first to sixth transistors ST1, ST2, ST3, ST4, ST5, and ST6, and a first capacitor C1.

The driving transistor DT may include an active area DT_ACT, a gate electrode DT_G, a source electrode DT_S, and a drain electrode DT_D. The active area DT_ACT of the driving transistor DT may overlap the gate electrode DT_G of the driving transistor DT disposed in a first gate layer GTL1.

The gate electrode DT_G of the driving transistor DT may be connected to a first connection electrode BE1 through a first contact hole CNT1, and the first connection electrode BE1 may be connected to the drain electrode D1-2 of the first-second transistor ST1-2 and the drain electrode D2-2 of the second-second transistor ST2-2 through a sixth contact hole CNT6. Further, an area of the gate electrode DT_G of the driving transistor DT, which overlaps a second gate layer GTL2, may correspond to the first electrode CE11 of the first capacitor C1.

The source electrode DT_S of the driving transistor DT may be connected to the drain electrode D3 of the third transistor ST3 and the drain electrode D4 of the fourth transistor ST4.

The drain electrode DT_D of the driving transistor DT may be connected to the source electrode S1-1 of the first-first transistor ST1-1 and the source electrode S5 of the fifth transistor ST5.

The first transistor ST1 may be a dual transistor including the first-first transistor ST1-1 and the first-second transistor ST1-2.

The first-first transistor ST1-1 may include an active area ACT1-1, a gate electrode G1-1, a source electrode S1-1, and a drain electrode D1-1. The active area ACT1-1 of the first-first transistor ST1-1 may overlap the gate electrode G1-1 of the first-first transistor ST1-1. The gate electrode G1-1 of the first-first transistor ST1-1, which is a part of the scan line SLk of the corresponding stage, may correspond to an area of the scan line SLk of the corresponding stage overlapping the active area ACT1-1.

The source electrode S1-1 of the first-first transistor ST1-1 may be connected to the drain electrode DT_D of the driving transistor DT and the source electrode S5 of the fifth transistor ST5.

The drain electrode D1-1 of the first-first transistor ST1-1 may be connected to the source electrode S1-2 of the first-second transistor ST1-2.

The first-second transistor ST1-2 may include an active area ACT1-2, a gate electrode G1-2, a source electrode S1-2, and a drain electrode D1-2. The active area ACT1-2 of the first-second transistor ST1-2 may overlap the gate electrode G1-2 of the first-second transistor ST1-2. The gate electrode G1-2 of the first-second transistor ST1-2, which is a part of the scan line SLk of the corresponding stage, may correspond to an area of the scan line SLk of the corresponding stage overlapping the active area ACT1-2.

The source electrode S1-2 of the first-second transistor ST1-2 may be connected to the drain electrode D1-1 of the first-first transistor ST1-1.

The drain electrode D1-2 of the first-second transistor ST1-2 may be connected to the first connection electrode BE1 through the sixth contact hole CNT6, and the first connection electrode BE1 may be connected to the gate electrode DT_G of the driving transistor DT through the first contact hole CNT1. Further, the drain electrode D1-2 of the first-second transistor ST1-2 may be connected to the drain electrode D2-2 of the second-second transistor ST2-2.

A gate auxiliary electrode GAE may be disposed in the second gate layer GTL2. For example, the gate electrode G1-1 of the first-first transistor ST1-1 and the gate electrode G1-2 of the first-second transistor ST1-2 may be disposed in the first gate layer GTL1, and the second gate layer GTL2 may be disposed on the first gate layer GTL1. The gate auxiliary electrode GAE may be connected to the gate electrode G1-1 of the first-first transistor ST1-1 or the gate electrode G1-2 of the first-second transistor ST1-2. For example, the gate auxiliary electrode GAE may be connected to the gate electrode G1-1 of the first-first transistor ST1-1 through a fifth contact hole CNT5. Therefore, when the gate electrode G1-1 of the first-first transistor ST1-1 receives the scan signal SCk of the corresponding stage, the scan signal SCk may be supplied to the gate auxiliary electrode GAE.

At least a part of the gate auxiliary electrode GAE may be disposed between the active area ACT1-1 of the first-first transistor ST1-1 and the active area ACT1-2 of the first-second transistor ST1-2 in the second gate layer GTL2. The gate auxiliary electrode GAE may overlap the source electrode or drain electrode disposed between the active area ACT1-1 of the first-first transistor ST1-1 and the active area ACT1-2 of the first-second transistor ST1-2 in the thickness direction (Z-axis direction). For example, when the drain electrode D1-1 of the first-first transistor ST1-1 is in direct contact with the source electrode S1-2 of the first-second transistor ST1-2, the gate auxiliary electrode GAE may overlap at least one of the drain electrode D1-1 of the first-first transistor ST1-1 and the source electrode S1-2 of the first-second transistor ST1-2 in the thickness direction (Z-axis direction). Accordingly, an electric field may be formed between the gate auxiliary electrode GAE and the drain electrode D1-1 of the first-first transistor ST1-1 or between the gate auxiliary electrode GAE and the source electrode S1-2 of the first-second transistor ST1-2.

For example, the gate auxiliary electrode GAE may be connected to the gate electrode G1-1 of the first-first transistor ST1-1 through the fifth contact hole CNT5, and may overlap the drain electrode D1-1 of the first-first transistor ST1-1 and the source electrode S1-2 of the first-second transistor ST1-2 in the thickness direction (Z-axis direction). The electric field formed at the node between the first-first transistor ST1-1 and the first-second transistor ST1-2 may be influenced by an electric field between the gate electrode G1-1 of the first-first transistor ST1-1 and the drain electrode D1-1 of the first-first transistor ST1-1, an electric field between the gate electrode G1-2 of the first-second transistor ST1-2 and the source electrode S1-2 of the first-second transistor ST1-2, and an electric field between the gate auxiliary electrode GAE and the drain electrode D1-1 of the first-first transistor ST1-1. Here, when the first-first transistor ST1-1 and the first-second transistor ST1-2 are turned off, the node between the first-first transistor ST1-1 and the first-second transistor ST1-2 may correspond to a floating source/drain node.

The second transistor ST2 may be a dual transistor including the second-first transistor ST2-1 and the second-second transistor ST2-2.

The second-first transistor ST2-1 may include an active area ACT2-1, a gate electrode G2-1, a source electrode S2-1, and a drain electrode D2-1. The active area ACT2-1 of the second-first transistor ST2-1 may overlap the gate electrode G2-1 of the second-first transistor ST2-1. The gate electrode G2-1 of the second-first transistor ST2-1, which is a part of the scan line SLk-1 of the previous stage, may correspond to an area of the scan line SLk-1 of the previous stage overlapping the active area ACT2-1.

The source electrode S2-1 of the second-first transistor ST2-1 may be connected to a second connection electrode BE2 through an eighth contact hole CNT8, and the second connection electrode BE2 may be connected to the initialization voltage line VIL through a seventh contact hole CNT7. The source electrode S2-1 of the second-first transistor ST2-1 may be connected to the initialization voltage line VIL to receive the initialization voltage VI.

The drain electrode D2-1 of the second-first transistor ST2-1 may be connected to the source electrode S2-2 of the second-second transistor ST2-2.

The second-2 transistor ST2-2 may include an active area ACT2-2, a gate electrode G2-2, a source electrode S2-2, and a drain electrode D2-2.

The active area ACT2-2 of the second-second transistor ST2-2 may overlap the gate electrode G2-2 of the second-second transistor ST2-2. The gate electrode G2-2 of the second-second transistor ST2-2, which is a part of the scan line SLk-1 of the previous stage, may correspond to an area of the scan line SLk-1 of the previous stage overlapping the active area ACT2-2.

The source electrode S2-2 of the second-second transistor ST2-2 may be connected to the drain electrode D2-1 of the second-first transistor ST2-1.

The drain electrode D2-2 of the second-second transistor ST2-2 may be connected to the first connection electrode BE1 through the sixth contact hole CNT6, and the first connection electrode BE1 may be connected to the gate electrode DT_G of the driving transistor DT through the first contact hole CNT1. Further, the drain electrode D2-2 of the second-second transistor ST2-2 may be connected to the drain electrode D1-2 of the first-second transistor ST1-2.

The third transistor ST3 may include an active area ACT3, a gate electrode G3, a source electrode S3, and a drain electrode D3. The active area ACT3 of the third transistor ST3 may overlap the gate electrode G3 of the third transistor ST3. The gate electrode G3 of the third transistor ST3, which is a part of the scan line SLk of the corresponding stage, may correspond to an area of the scan line SLk of the corresponding stage overlapping the active area ACT3.

The source electrode S3 of the third transistor ST3 may be connected to the data line DL through a second contact hole CNT2. Accordingly, the source electrode S3 of the third transistor ST3 may receive the data voltage Vdata from the data line DL.

The drain electrode D3 of the third transistor ST3 may be connected to the source electrode DT_S of the driving transistor DT and the drain electrode D4 of the fourth transistor ST4.

The fourth transistor ST4 may include an active area ACT4, a gate electrode G4, a source electrode S4, and a drain electrode D4. The active area ACT4 of the fourth transistor ST4 may overlap the gate electrode G4 of the fourth transistor ST4. The gate electrode G4 of the fourth transistor ST4, which is a part of the emission control line EML, may correspond to an area of the emission control line EML overlapping the active area ACT4.

The source electrode S4 of the fourth transistor ST4 may be connected to the second driving voltage line VDDL2 through a ninth contact hole CNT9. Therefore, the source electrode S4 of the fourth transistor ST4 may receive the driving voltage VDD from the second driving voltage line VDDL2.

The drain electrode D4 of the fourth transistor ST4 may be connected to the source electrode DT_S of the driving transistor DT and the drain electrode D3 of the third transistor ST3.

The fifth transistor ST5 may include an active area ACT5, a gate electrode G5, a source electrode S5, and a drain electrode D5. The active area ACT5 of the fifth transistor ST5 may overlap the gate electrode G5 of the fifth transistor ST5. The gate electrode G5 of the fifth transistor ST5, which is a part of the emission control line EML, may correspond to an area of the emission control line EML overlapping the active area ACT5.

The source electrode S5 of the fifth transistor ST5 may be connected to the drain electrode DT_D of the driving transistor DT and the source electrode of the second-first transistor ST2-1.

The drain electrode D5 of the fifth transistor ST5 may be connected to a fourth connection electrode BE4 through a fourth contact hole CNT4, and the fourth connection electrode BE4 may be connected to an anode connection electrode ANDE through a twelfth contact hole CNT12. The anode connection electrode ANDE may be connected to the anode electrode of the light emitting element EL.

The sixth transistor ST6 may include an active area ACT6, a gate electrode G6, a drain electrode D6, and a source electrode S6. The active area ACT6 of the sixth transistor ST6 may overlap the gate electrode G6 of the sixth transistor ST6. The gate electrode G6 of the sixth transistor ST6, which is a part of the scan line SLk of the corresponding stage, may correspond to an area of the scan line SLk of the corresponding stage overlapping the active area ACT6.

The source electrode S6 of the sixth transistor ST6 may be connected to a third connection electrode BE3 through an eleventh contact hole CNT11, and the third connection electrode BE3 may be connected to the initialization voltage line VIL through a tenth contact hole CNT10. The source electrode S6 of the sixth transistor ST6 is connected to the initialization voltage line VIL to receive the initialization voltage VI.

The drain electrode D6 of the sixth transistor ST6 may be connected to the fourth connection electrode BE4 through the fourth contact hole CNT4, and the fourth connection electrode BE4 may be connected to the anode connection electrode ANDE through the twelfth contact hole CNT12. The anode connection electrode ANDE may be connected to the anode electrode of the light emitting element EL.

The first capacitor C1 may include a first electrode CE11 and a second electrode CE12. The first electrode CE11 of the first capacitor C1, which is a part of the gate electrode DT_G of the driving transistor DT, may correspond to an area of the gate electrode DT-G of the driving transistor DT overlapping the second gate layer GTL2. The first electrode CE11 of the first capacitor C1 may be connected to the first connection electrode BE1 through the first contact hole CNT1, and the first connection electrode BE1 may be connected to the drain electrode D1-2 of the first-second transistor ST2 and the drain electrode D2-2 of the second-second transistor ST2-2 through the sixth contact hole CNT6.

The driving voltage line VDDL may include a first driving voltage line VDDL1 and a second driving voltage line VDDL2. For example, the first driving voltage line VDDL1 may be disposed in the second gate layer GTL2, and the second driving voltage line VDDL2 may be disposed on the source-drain layer SDL. The first driving voltage line VDDL1 may be connected to the second driving voltage line VDDL2 through a third contact hole CNT3.

The second electrode CE12 of the first capacitor C1, which is a part of the first driving voltage line VDDL1, may correspond to an area of the first driving voltage line overlapping the gate electrode DT_G of the driving transistor DT_G.

Referring to FIG. 7 together with FIG. 8, the display panel 300 includes a substrate SUB, a buffer layer BF, an active layer ACTL, a gate insulating film GI, a first gate layer GTL1, a first interlayer insulating film ILD1, a second gate layer GTL2, a second interlayer insulating film ILD2, a source-drain layer SDL, and a passivation layer PAS.

The substrate SUB may be a base substrate, and may be made of an insulating material such as a polymer resin. For example, the substrate SUB may be a flexible substrate capable of bending, folding, rolling, or the like.

The buffer layer BF may be disposed on the substrate BUF. For example, the buffer layer BF may include a plurality of inorganic films, and the buffer layer BF may be formed on the entire upper surface of the substrate SUB to block moisture penetrating the light emitting element EL through the substrate SUB.

The active layer ACTL may be disposed on the buffer layer BF. The active layer ACTL may be made of a silicon-based material. For example, the active layer ACTL may be made of low-temperature polycrystalline silicon (LTPS). The active areas DT_ACT and ACT1, ACT2, ACT3, ACT4, ACT5, and to ACT6, source electrodes DT_S and S1, S2, S3, S4, S5, and S6, and drain electrodes DT_D and D1, D2, D3, D4, D5, D6 of the driving transistor DT and the first to sixth transistors ST1, ST2, ST3, ST4, ST5, and ST6 may be disposed in the active layer ACTL.

The gate insulating film GI may cover the buffer layer BF and the active layer ACTL, and may insulate the active layer ACTL from the first gate layer GTL1 or insulate the first gate layer GTL1 from the active layer ACTL.

The first gate layer GTL1 may be disposed on the gate insulating film GI. The gate electrode DT_G of the driving transistor DT, the scan line SLk-1 of the previous stage, the scan line SLk of the corresponding stage, and the emission control line EML may be disposed in the first gate layer GTL1.

A part of the gate electrode DT_G of the driving transistor DT may form the first electrode CE11 of the first capacitor C1 which overlaps the second electrode CE12 of the first capacitor C1 disposed in the second gate layer GTL2.

A part of the scan line SLk of the corresponding stage may overlap the active area ACT1-1 of the first-first transistor ST1-1 and the active area ACT1-2 of the first-second transistor ST1-2 to form the gate electrode G1-1 of the first-first transistor ST1-1 and the gate electrode G1-2 of the first-second transistor ST1-2, respectively. Another part of the scan line SLk of the corresponding stage may overlap the active area ACT3 of the third transistor ST3 to form the gate electrode G3 of the third transistor ST3. Another part of the scan line SLk of the corresponding stage may overlap the active area ACT6 of the sixth transistor ST6 to form the gate electrode G6 of the sixth transistor ST6.

A part of the scan line SLk-1 of the previous stage may overlap the active area ACT2-1 of the second-first transistor ST2-1 and the active area ACT2-2 of the second-second transistor ST2-2 to form the gate electrode G2-1 of the second-first transistor ST2-1 and the gate electrode G2-2 of the second-second transistor ST2-2, respectively.

A part of the emission control line EML may overlap the active area ACT4 of the fourth transistor ST4 to form the gate electrode G4 of the fourth transistor ST4. Another part of the emission control line EML may overlap the active area ACT5 of the fifth transistor ST5 to form the gate electrode G5 of the fifth transistor ST5.

The first interlayer insulating film ILD1 may cover the first gate layer GTL1 and the gate insulating film GI. The first interlayer insulating film ILD1 may insulate the first gate layer GTL1 and the second gate layer GTL2.

The second gate layer GTL2 may be disposed on the first interlayer insulating film ILD1. Apart of the second gate layer GTL2 may overlap the first electrode CE11 disposed in the first gate layer GTL1 to form the second electrode CE12 of the first capacitor C1. Another part of the second gate layer GTL2 may form the first driving voltage line VDDL1 Another part of the second gate layer GTL2 may form the gate auxiliary electrode GAE. The initialization voltage line VIL may be disposed in the second gate layer GTL2.

The second interlayer insulating film ILD2 may cover the second gate layer GTL2 and the first interlayer insulating film ILD1. The second interlayer insulating film ILD2 may insulate the second gate layer GTL2 from the source-drain layer SDL, or insulate the source-drain layer SDL from the second gate layer GTL2.

The source-drain layer SDL may be disposed on the second interlayer insulating film ILD2. The first to fourth connection electrodes BE1, BE2, BE3, and BE4, the data line DL, and the second driving voltage line VDDL2 may be disposed on the source-drain layer SDL.

The passivation layer PAS may cover the source-drain layer SDL and the second interlayer insulating film ILD2. The passivation layer PAS may insulate the anode connection electrode ANDE from the source-drain layer SDL, or insulate the source-drain layer SDL from the anode connection electrode ANDE.

Figure 9:
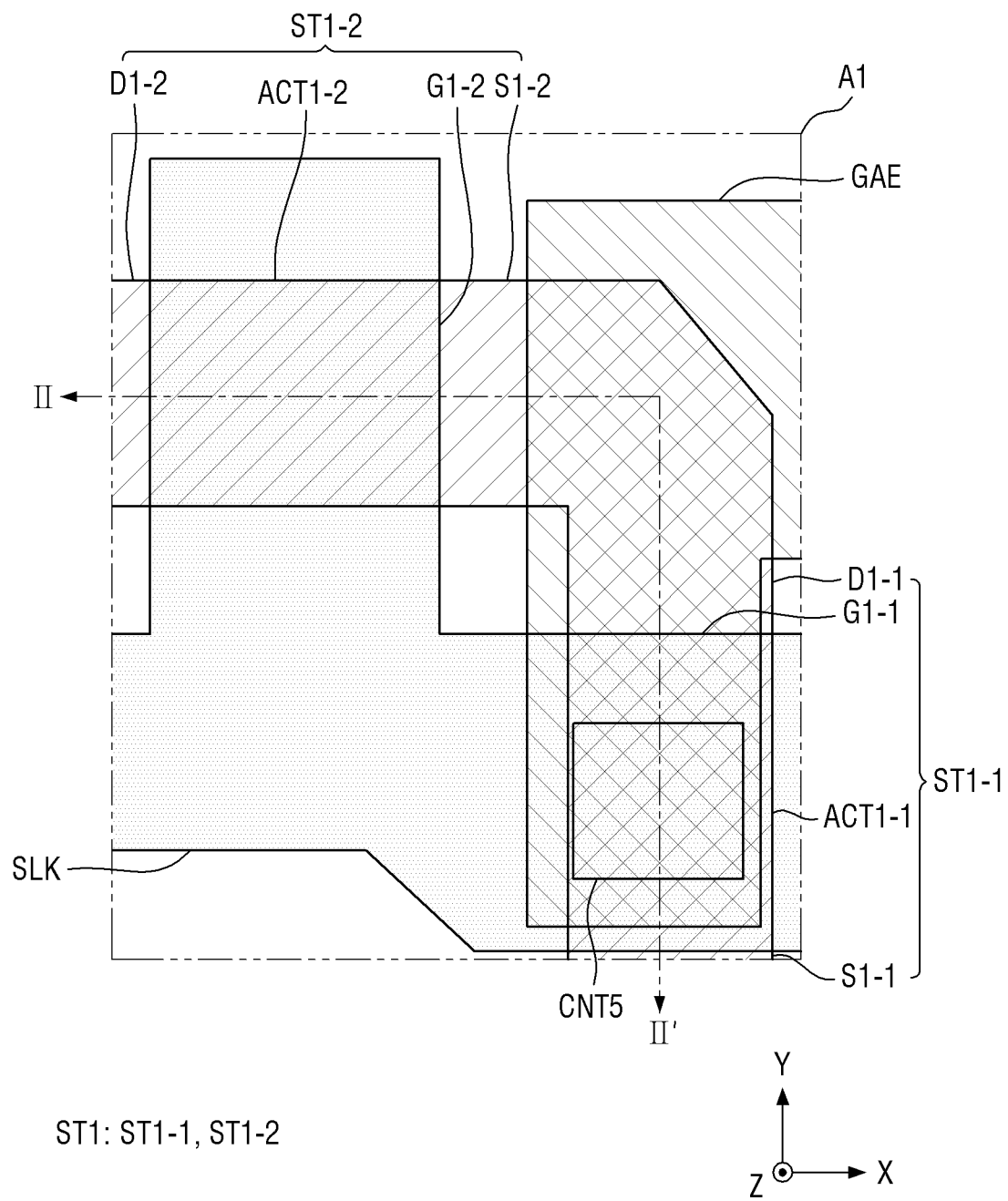
FIG. 9 is an enlarged view of the area A1 in FIG. 7.
Figure 10:
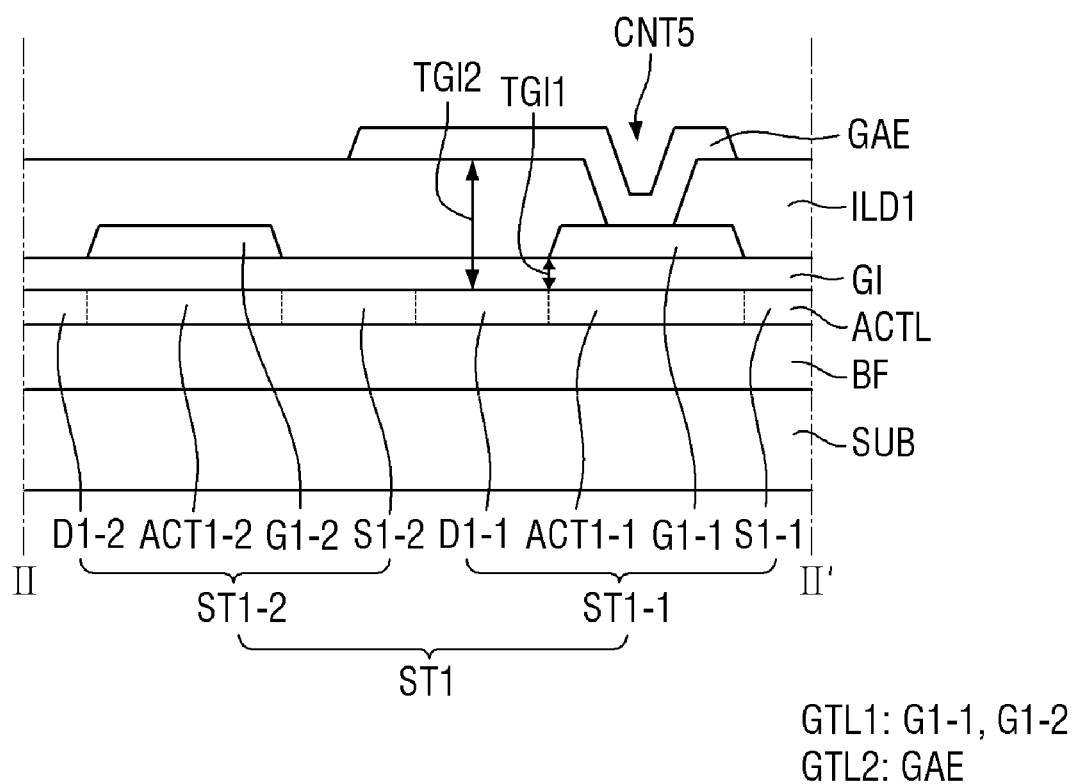
FIG. 10 is a cross-sectional view taken along line II-II' in FIG. 9.

FIG. 9 is an enlarged view of the area A1 in FIG. 7, and FIG. 10 is a cross-sectional view taken along line II-II' in FIG. 9.

Referring to FIGS. 9 and 10, the first transistor ST1 may be a dual transistor including the first-first transistor ST1-1 and the first-second transistor ST1-2.

The gate auxiliary electrode GAE may be disposed in the second gate layer GTL2. For example, the gate electrode G1-1 of the first-first transistor ST1-1 and the gate electrode G1-2 of the first-second transistor ST1-2 may be disposed in the first gate layer GTL1, and the second gate layer GTL2 may be disposed on the first gate layer GTL1. The gate auxiliary electrode GAE may be connected to the gate electrode G1-1 of the first-first transistor ST1-1 or the gate electrode G1-2 of the first-second transistor ST1-2. For example, the gate auxiliary electrode GAE may be connected to the gate electrode G1-1 of the first-first transistor ST1-1 through the fifth contact hole CNT5. Therefore, when the gate electrode G1-1 of the first-first transistor ST1-1 receives the scan signal SCk of the corresponding stage, the scan signal SCk may be supplied to the gate auxiliary electrode GAE.

At least a part of the gate auxiliary electrode GAE may be disposed between the active area ACT1-1 of the first-first transistor ST1-1 and the active area ACT1-2 of the first-second transistor ST1-2 in the second gate layer GTL2. The gate auxiliary electrode GAE may overlap the source electrode or drain electrode disposed between the active area ACT1-1 of the first-first transistor ST1-1 and the active area ACT1-2 of the first-second transistor ST1-2 in the thickness direction (Z-axis direction). For example, when the drain electrode D1-1 of the first-first transistor ST1-1 is in direct contact with the source electrode S1-2 of the first-second transistor ST1-2, the gate auxiliary electrode GAE may overlap at least one of the drain electrode D1-1 of the first-first transistor ST1-1 and the source electrode S1-2 of the first-second transistor ST1-2 in the thickness direction (Z-axis direction). Therefore, an electric field may be formed between the gate auxiliary electrode GAE and the drain electrode D1-1 of first-first transistor ST1-1 or between the gate auxiliary electrode GAE and the source electrode S1-2 of the first-second transistor ST1-2.

For example, the gate auxiliary electrode GAE may be connected to the gate electrode G1-1 of the first-first transistor ST1-1 through the fifth contact hole CNT5, and may overlap the drain electrode D1-1 of the first-first transistor ST1-1 and the source electrode S1-2 of the first-second transistor ST1-2 in the thickness direction (Z-axis direction). The electric field formed at the node between the first-first transistor ST1-1 and the first-second transistor ST1-2 may be influenced by an electric field between the gate electrode G1-1 of the first-first transistor ST1-1 and the drain electrode D1-1 of the first-first transistor ST1-1, an electric field between the gate electrode G1-2 of the first-second transistor ST1-2 and the source electrode S1-2 of the first-second transistor ST1-2, and an electric field between the gate auxiliary electrode GAE and the drain electrode D1-1 of the first-first transistor ST1-1.

The intensity of the electric field may proportional to a potential difference between electrodes, and may be inversely proportional to a distance between the electrodes. For example, the distance TGI2 between the gate auxiliary electrode GAE and the drain electrode D1-1 of the first-first transistor ST1-1 may be longer than the distance TGI1 between the gate electrode G1-1 and the drain electrode D1-1 of the first-first transistor ST1-1. The intensity of the electric field between the gate auxiliary electrode GAE and the drain electrode D1-1 of the first-first transistor ST1-1 may be lower than the intensity of the electric field between the gate electrode G1-1 and the drain electrode D1-1 of the first-first transistor ST1-1. Therefore, as the gate auxiliary electrode GAE is connected to the gate electrode G1-1 of the first-first transistor ST1-1, the electric field between the gate auxiliary electrode GAE and the drain electrode D1-1 of the first-first transistor ST1-1 may be reduced, and the electric field formed at the node between the first-first transistor ST1-1 and the first-second transistor ST1-2 may be reduced. As the electric field formed at the node between the first-first transistor ST1-1 and the first-second transistor ST1-2 is reduced, the leakage current flowing through the first-first transistor ST1-1 and the first-second transistor ST1-2 may be reduced, and the drop in luminance of sub-pixels SP may be prevented.

Figure 11:
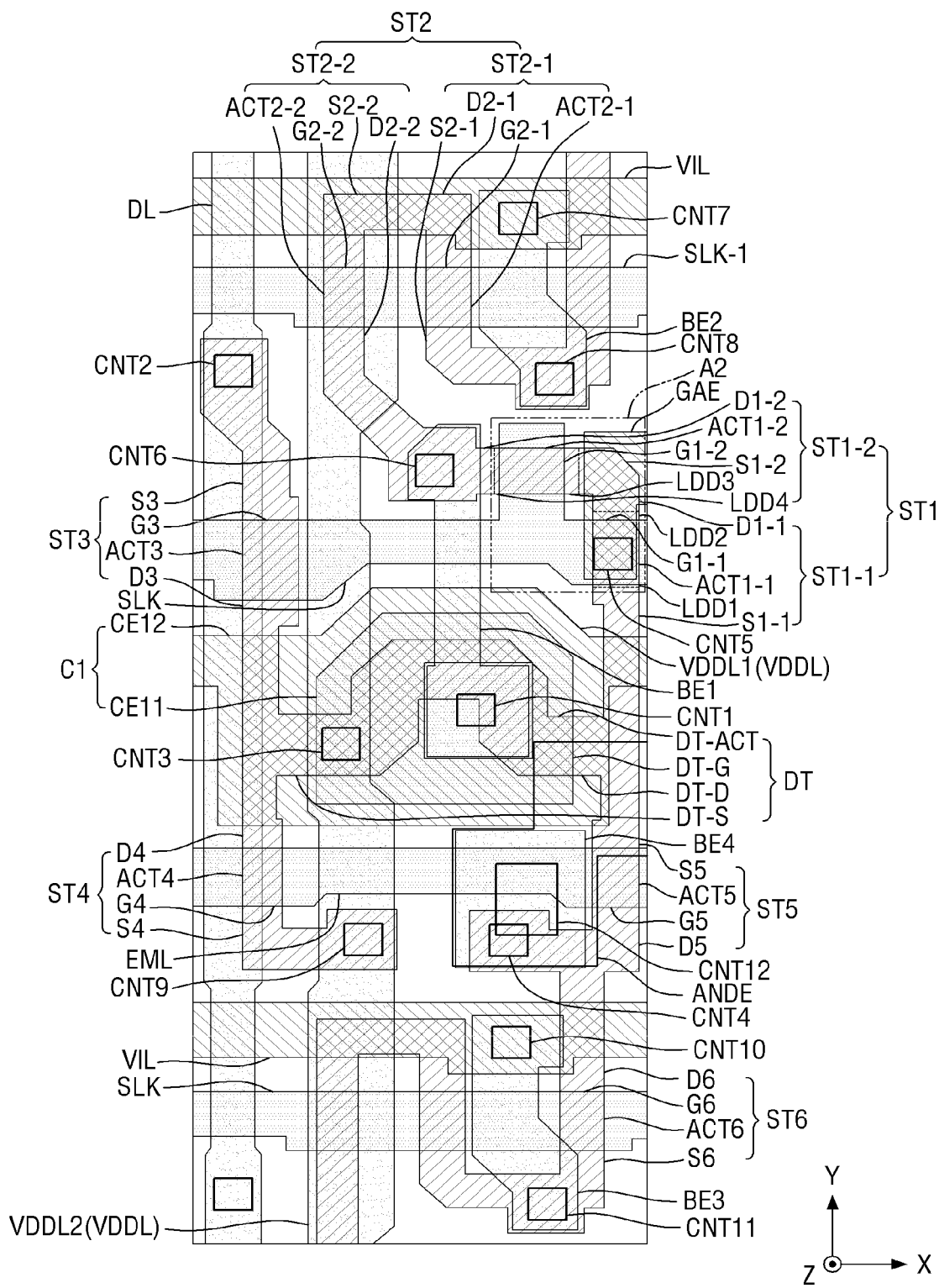
FIG. 11 is a plan view illustrating another example of the sub-pixel illustrated in FIG. 5.
Figure 12:
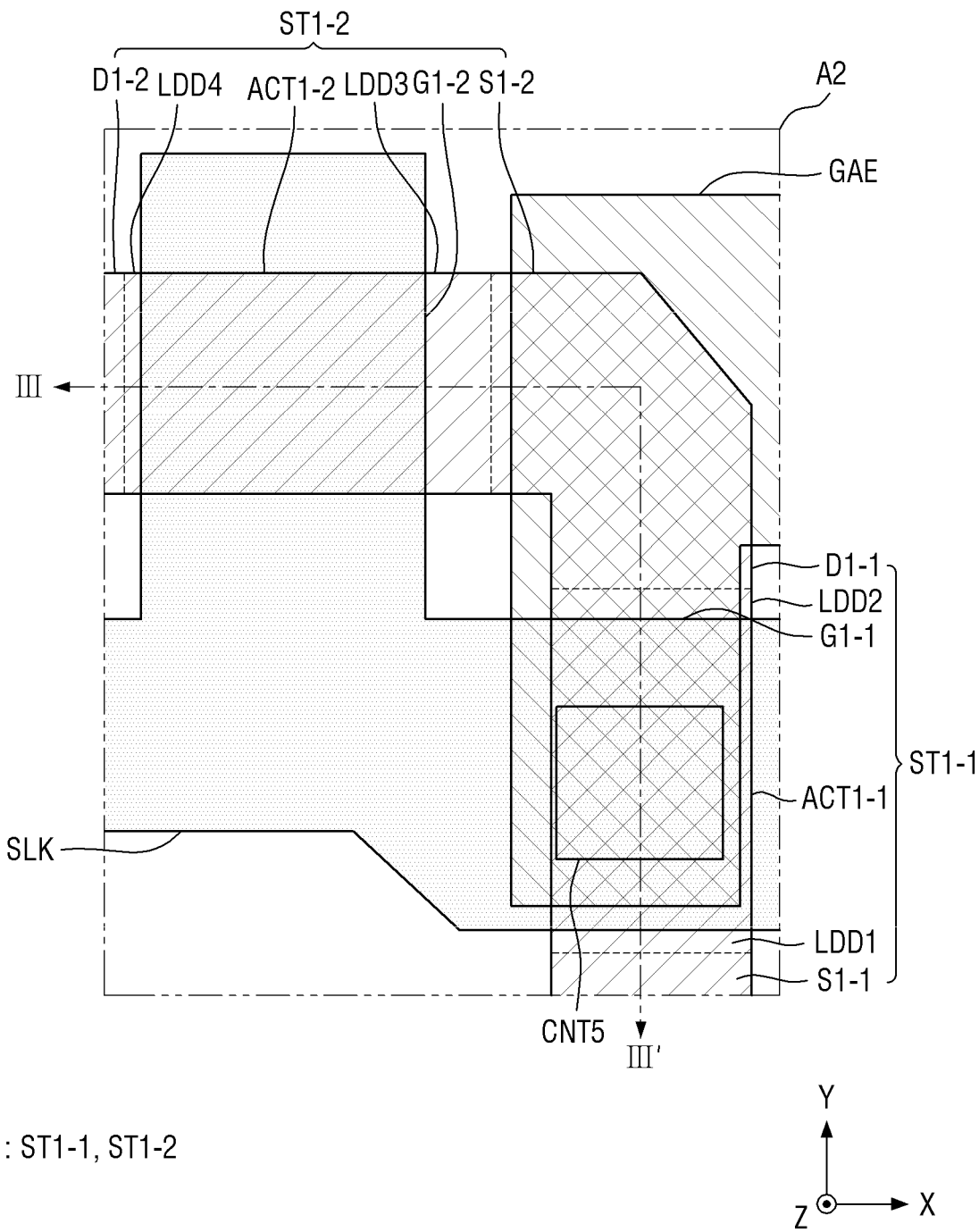
FIG. 12 is an enlarged view of the area A2 in FIG. 11.
Figure 13:
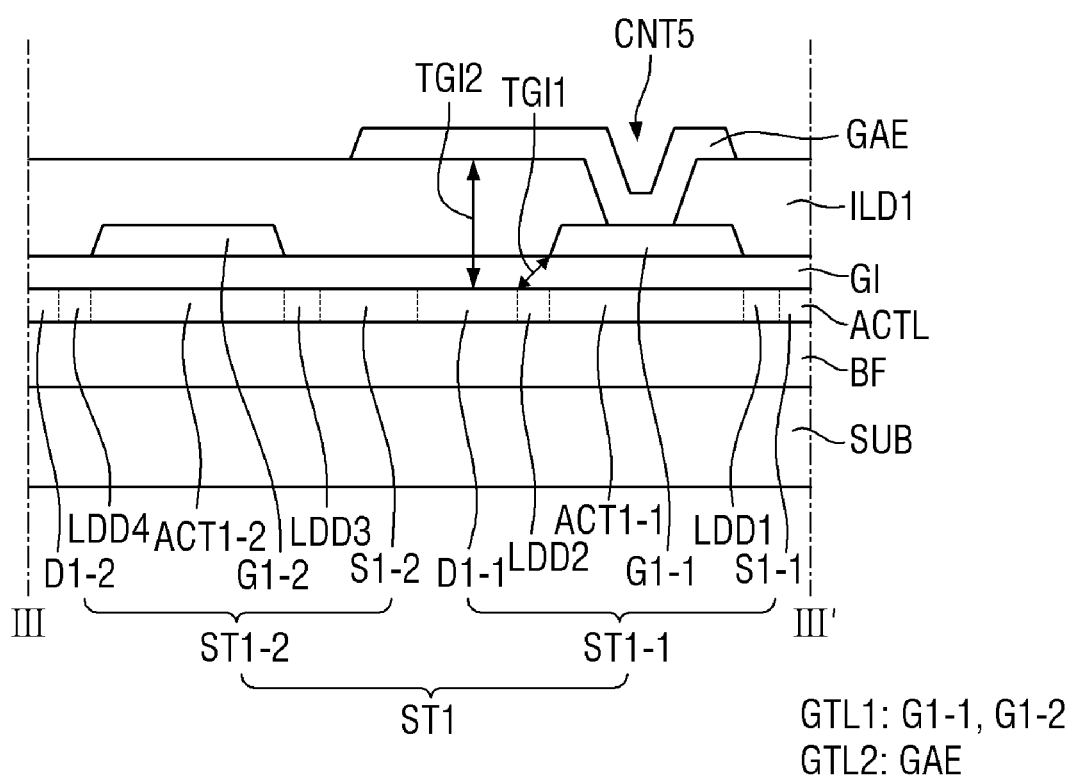
FIG. 13 is a cross-sectional view taken along line III-III' in FIG. 12.

FIG. 11 is a plan view illustrating another example of the sub-pixel illustrated in FIG. 5, FIG. 12 is an enlarged view of the area A2 in FIG. 11, and FIG. 13 is a cross-sectional view taken along line III-III' in FIG. 12. The sub-pixel of FIGS. 11, 12, and 13 is different from the sub-pixel of FIGS. 7, 8, 9, and 10 in that it further includes first, second, third, and fourth doped areas. Thus, the same components as the aforementioned components will be briefly described or omitted.

Referring to FIGS. 11, 12, and 13, the first transistor ST1 may be turned on by the scan signal SCk of the scan line SLk of the corresponding stage to connect the first node N1, which is a drain electrode of the driving transistor DT, to the second node N2, which is a gate electrode of the driving transistor DR. The first transistor ST1 may be a dual transistor including a first-first transistor ST1-1 and a first-second transistor ST1-2.

The first-first transistor ST1-1 may include an active area ACT1-1, a gate electrode G1-1, a source electrode S1-1, a drain electrode D1-1, a first doped area LDD1, and a second doped area LDD2. The active area ACT1-1 of the first-first transistor ST1-1 may overlap the gate electrode G1-1 of the first-first transistor ST1-1. The gate electrode G1-1 of the first-first transistor ST1-1, which is a part of the scan line SLk of the corresponding stage, may correspond to an area of the scan line SLk of the corresponding stage overlapping the active area ACT1-1.

The source electrode S1-1 of the first-first transistor ST1-1 may be connected to the drain electrode DT_D of the driving transistor DT and the source electrode S5 of the fifth transistor ST5.

The drain electrode D1-1 of the first-first transistor ST1-1 may be connected to the source electrode S1-2 of the first-second transistor ST1-2.

The first doped area LDD1 of the first-first transistor ST1-1 may be disposed between the active area ACT1-1 and the source electrode S1-1 of the first-first transistor ST1-1.

For example, the doping concentration of the first doped area LDD1 may be higher than the doping concentration of each of the active area ACT1-1 of the first-first transistor ST1-1 and the active area ACT1-2 of the first-second transistor ST1-2. The doping concentration of the first doped area LDD1 may be lower than the doping concentration of each of the source electrode S1-1 and the drain electrode D1-1 of the first-first transistor ST1-1. The doping concentration of the first doped area LDD1 may be lower than the doping concentration of each of the source electrode S1-2 and the drain electrode D1-2 of the first-second transistor ST1-2.

The second doped area LDD2 of the first-first transistor ST1-1 may be disposed between the active area ACT1-1 and the drain electrode D1-1 of the first-first transistor ST1-1. For example, the doping concentration of the second doped area LDD2 may be higher than the doping concentration of each of the active area ACT1-1 of the first-first transistor ST1-1 and the active area ACT1-2 of the first-second transistor ST1-2. The doping concentration of the second doped area LDD2 may be lower than the doping concentration of each of the source electrode S1-1 and the drain electrode D1-1 of the first-first transistor ST1-1. The doping concentration of the second doped area LDD2 may be lower than the doping concentration of each of the source electrode S1-2 and the drain electrode D1-2 of the first-second transistor ST1-2.

The first-second transistor ST1-2 may include an active area ACT1-2, a gate electrode G1-2, a source electrode S1-2, a drain electrode D1-2, and a third doped area LDD3, and a fourth doped area LDD4. The active area ACT1-2 of the first-second transistor ST1-2 may overlap the gate electrode G1-2 of the first-second transistor ST1-2. The gate electrode G1-2 of the first-second transistor ST1-2, which is a part of the scan line SLk of the corresponding stage, may correspond to an area of the scan line SLk of the corresponding stage overlapping the active area ACT1-2.

The source electrode S1-2 of the first-second transistor ST1-2 may be connected to the drain electrode D1-1 of the first-first transistor ST1-1.

The drain electrode D1-2 of the first-second transistor ST1-2 may be connected to the first connection electrode BE1 through the sixth contact hole CNT6, and the first connection electrode BE1 may be connected to the gate electrode DT_G of the driving transistor DT through the first contact hole CNT1. Further, the drain electrode D1-2 of the first-second transistor ST1-2 may be connected to the drain electrode D1-2 of the first-second transistor ST1-2.

The third doped area LDD3 of the first-second transistor ST1-2 may be disposed between the active area ACT1-2 and the source electrode S1-2 of the first-second transistor ST1-2. For example, the doping concentration of the third doped area LDD3 may be higher than the doping concentration of each of the active area ACT1-1 of the first-first transistor ST1-1 and the active area ACT1-2 of the first-second transistor ST1-2. The doping concentration of the third doped area LDD3 may be lower than the doping concentration of each of the source electrode S1-1 and the drain electrode D1-1 of the first-first transistor ST1-1. The doping concentration of the third doped area LDD3 may be lower than the doping concentration of each of the source electrode S1-2 and the drain electrode D1-2 of the first-second transistor ST1-2.

The fourth doped area LDD4 of the first-second transistor ST1-2 may be disposed between the active area ACT1-2 and the drain electrode D1-2 of the first-second transistor ST1-2. For example, the doping concentration of the fourth doped area LDD4 may be higher than the doping concentration of each of the active area ACT1-1 of the first-first transistor ST1-1 and the active area ACT1-2 of the first-second transistor ST1-2. The doping concentration of the fourth doped area LDD4 may be lower than the doping concentration of each of the source electrode S1-1 and the drain electrode D1-1 of the first-first transistor ST1-1. The doping concentration of the fourth doped area LDD4 may be lower than the doping concentration of each of the source electrode S1-2 and the drain electrode D1-2 of the first-second transistor ST1-2.

The gate auxiliary electrode GAE may be disposed in the second gate layer GTL2. For example, the gate electrode G1-1 of the first-first transistor ST1-1 and the gate electrode G1-2 of the first-second transistor ST1-2 may be disposed in the first gate layer GTL1, and the second gate layer GTL2 may be disposed on the first gate layer GTL1. The gate auxiliary electrode GAE may be connected to the gate electrode G1-1 of the first-first transistor ST1-1 or the gate electrode G1-2 of the first-second transistor ST1-2. For example, the gate auxiliary electrode GAE may be connected to the gate electrode G1-1 of the first-first transistor ST1-1 through the fifth contact hole CNT5. Therefore, when the gate electrode G1-1 of the first-first transistor ST1-1 receives the scan signal SCk of the corresponding stage, the scan signal SCk may be supplied to the gate auxiliary electrode GAE.

At least a part of the gate auxiliary electrode GAE may be disposed between the active area ACT1-1 of the first-first transistor ST1-1 and the active area ACT1-2 of the first-second transistor ST1-2 in the second gate layer GTL2. The gate auxiliary electrode GAE may overlap the source electrode or drain electrode disposed between the active area ACT1-1 of the first-first transistor ST1-1 and the active area ACT1-2 of the first-second transistor ST1-2 in the thickness direction (Z-axis direction). For example, when the drain electrode D1-1 of the first-first transistor ST1-1 is in direct contact with the source electrode S1-2 of the first-second transistor ST1-2, the gate auxiliary electrode GAE may overlap at least one of the drain electrode D1-1 of the first-first transistor ST1-1 and the source electrode S1-2 of the first-second transistor ST1-2 in the thickness direction (Z-axis direction). Therefore, an electric field may be formed between the gate auxiliary electrode GAE and the drain electrode D1-1 of first-first transistor ST1-1 or between the gate auxiliary electrode GAE and the source electrode S1-2 of the first-second transistor ST1-2.

The gate auxiliary electrode GAE may overlap the second doped area LDD2 of the first-first transistor ST1-1 or the third doped area LDD3 of the first-second transistor ST1-2 in the thickness direction (Z-axis direction). For example, the gate auxiliary electrode GAE may be connected to the gate electrode G1-1 of the first-first transistor ST1-1 through the fifth contact hole CNT5, and may overlap the drain electrode D1-1 of the first-first transistor ST1-1, the source electrode S1-2 of the first-second transistor ST1-2, and the second doped area LDD2 in the thickness direction (Z-axis direction). The electric field formed at the node between the first-first transistor ST1-1 and the first-second transistor ST1-2 may be influenced by an electric field between the gate electrode G1-1 of the first-first transistor ST1-1 and the drain electrode D1-1 of the first-first transistor ST1-1, an electric field between the gate electrode G1-2 of the first-second transistor ST1-2 and the source electrode S1-2 of the first-second transistor ST1-2, an electric field between the gate auxiliary electrode GAE and the source electrode S1-2 of the first-second transistor ST1-2, and an electric filed between the gate auxiliary electrode GAE and the source electrode S1-2 of the first-second transistor ST1-2. For another example, the arrangement of the gate auxiliary electrode GAE is not limited to that illustrated in FIGS. 11, 12, and 13, and the gate auxiliary electrode GAE may also overlap the third doped area LDD.

The intensity of the electric field may proportional to a potential difference between electrodes, and may be inversely proportional to a distance between the electrodes. For example, the distance TGI2 between the gate auxiliary electrode GAE and the drain electrode D1-1 of the first-first transistor ST1-1 may be longer than the distance TGI1 between the gate electrode G1-1 and the drain electrode D1-1 of the first-first transistor ST1-1. In this case, since the gate electrode G1-1 does not overlap the drain electrode D1-1 of the first-first transistor ST1-1 due to the second doped area LLD2 disposed between the active area ACT1-1 and the drain electrode D1-1, the distance TGI1 is slanted. The intensity of the electric field between the gate auxiliary electrode GAE and the drain electrode D1-1 of the first-first transistor ST1-1 may be lower than the intensity of the electric field between the gate electrode G1-1 and the drain electrode D1-1 of the first-first transistor ST1-1. Therefore, as the gate auxiliary electrode GAE is connected to the gate electrode G1-1 of the first-first transistor ST1-1, the electric field between the gate auxiliary electrode GAE and the drain electrode D1-1 of the first-first transistor ST1-1 may be reduced, and the electric field formed at the node between the first-first transistor ST1-1 and the first-second transistor ST1-2 may be reduced. As the electric field formed at the node between the first-first transistor ST1-1 and the first-second transistor ST1-2 is reduced, the leakage current flowing through the first-first transistor ST1-1 and the first-second transistor ST1-2 may be reduced, and the drop in luminance of sub-pixels SP may be prevented.

Since the first-first transistor ST1-1 of FIGS. 11, 12, and 13 further includes the second doped area LDD2, the distance TGI1 between the gate electrode G1-1 and the drain electrode D1-1 of the first-first transistor ST1-1 of FIGS. 11, 12, and 13 may be longer than the distance TGI1 between the gate electrode G1-1 and the drain electrode D1-1 of the first-first transistor ST1-1 of FIGS. 7, 8, 9, and 10. The intensity of the electric field between the gate electrode G1-1 and the drain electrode D1-1 of the first-first transistor ST1-1 of FIGS. 11, 12, and 13 may be lower than the intensity of the electric field between the gate electrode G1-1 and the drain electrode D1-1 of the first-first transistor ST1-1 of FIGS. 7, 8, 9, and 10. Accordingly, the electric field formed at the node between the first-first transistor ST1-1 and the first-second transistor ST1-2 in FIGS. 11, 12, and 13 may be further reduced as compared with the electric field formed at the node between the first-first transistor ST1-1 and the first-second transistor ST1-2 in FIGS. 7, 8, 9, and 10. As the electric field formed at the node between the first-first transistor ST1-1 and the first-second transistor ST1-2 is reduced, the leakage current flowing through the first-first transistor ST1-1 and the first-second transistor ST1-2 may be reduced, and the drop in luminance of sub-pixels SP may be prevented.

Figure 14:
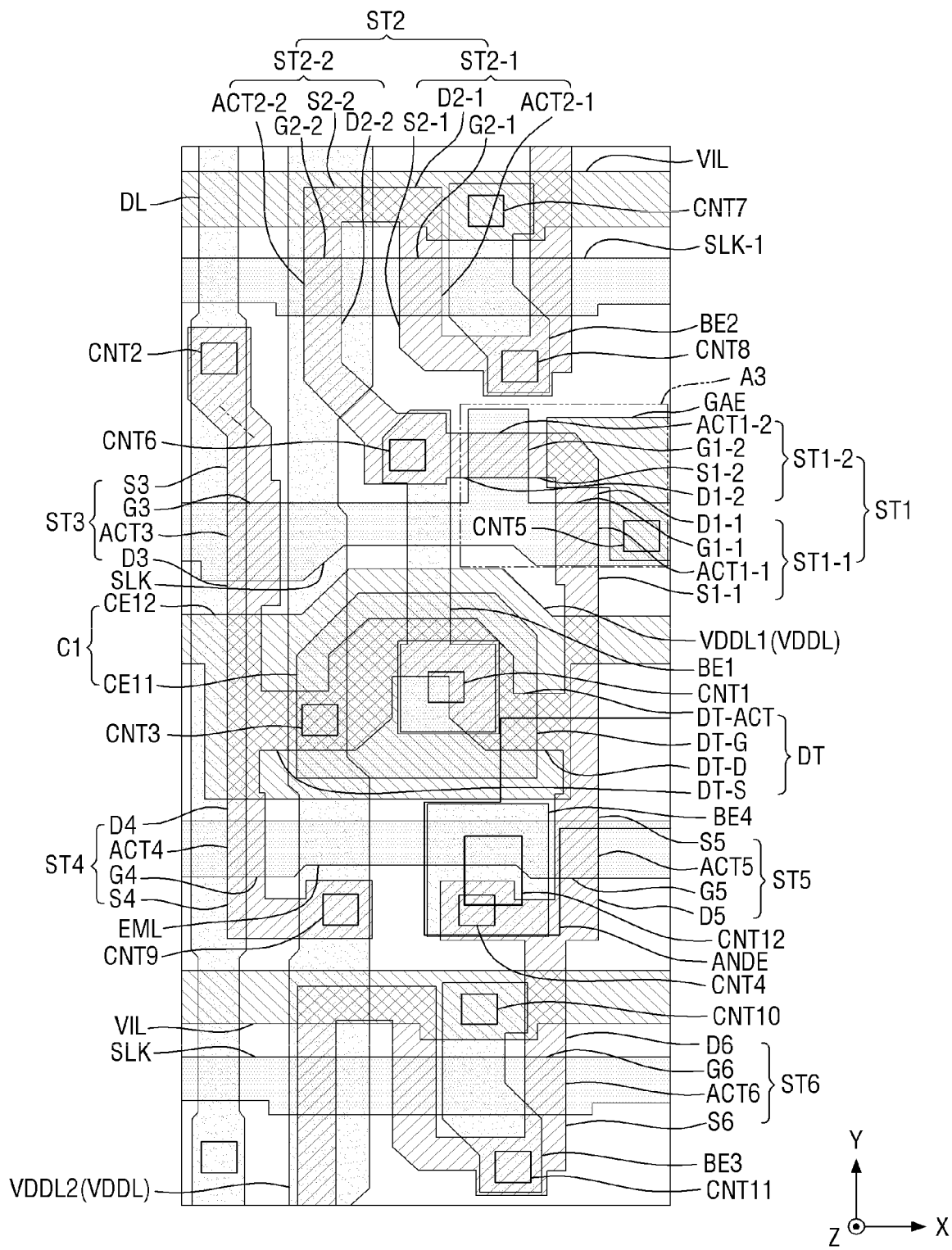
FIG. 14 is a plan view illustrating another example of the sub-pixel illustrated in FIG. 5.
Figure 15:
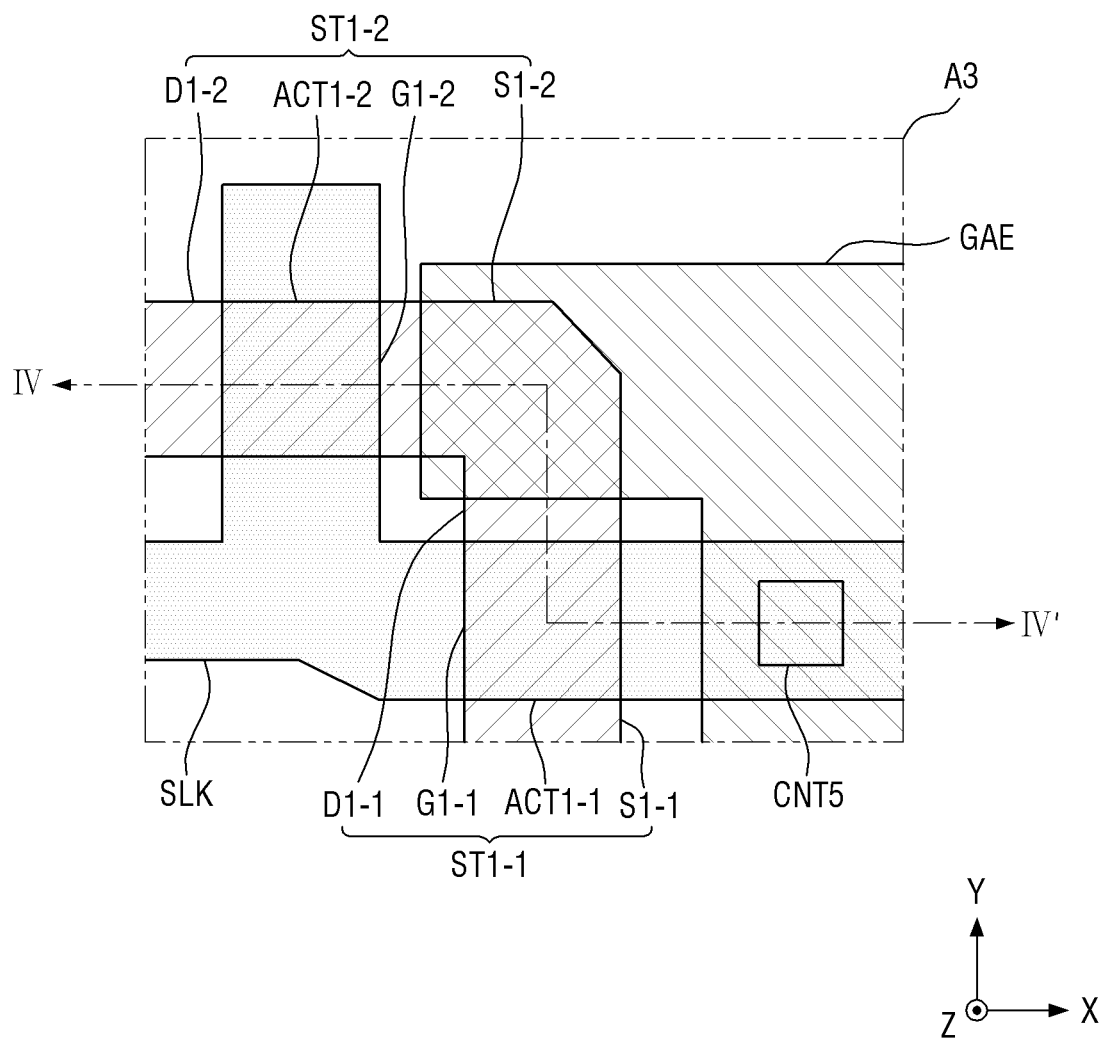
FIG. 15 is an enlarged view of the area A3 in FIG. 14.
Figure 16:
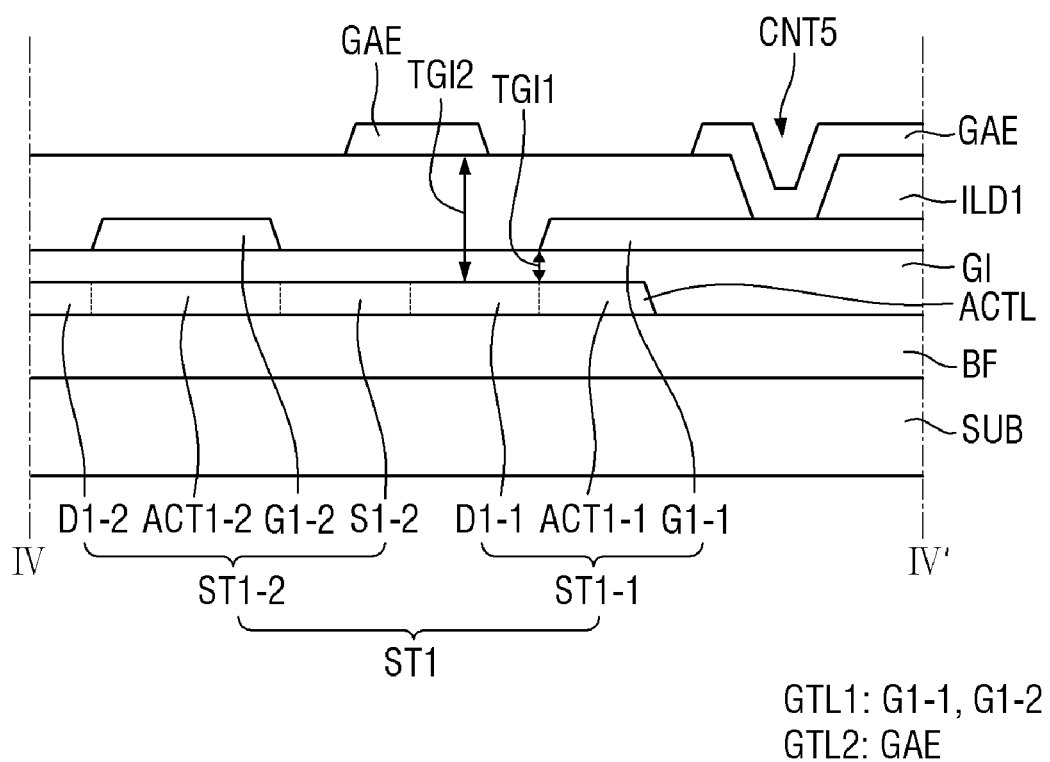
FIG. 16 is a cross-sectional view taken along line IV-IV' in FIG. 15.

FIG. 14 is a plan view illustrating another example of the sub-pixel illustrated in FIG. 5, FIG. 15 is an enlarged view of the area A3 in FIG. 14, and FIG. 16 is a cross-sectional view taken along line IV-IV' in FIG. 15. The sub-pixel of FIGS. 14, 15, and 16 is different from the sub-pixel of FIGS. 7, 8, 9, and 10 in terms of the configuration of a gate auxiliary electrode GAE. Thus, the same components as the aforementioned components will be briefly described or omitted.

Referring to FIGS. 14, 15, and 16, the first transistor ST1 may be turned on by the scan signal SCk of the scan line SLk of the corresponding stage to connect the first node N1, which is a drain electrode of the driving transistor DT, to the second node N2, which is a gate electrode of the driving transistor DR. The first transistor ST1 may be a dual transistor including a first-first transistor ST1-1 and a first-second transistor ST1-2.

The gate auxiliary electrode GAE may be disposed in the second gate layer GTL2. For example, the gate electrode G1-1 of the first-first transistor ST1-1 and the gate electrode G1-2 of the first-second transistor ST1-2 may be disposed in the first gate layer GTL1, and the second gate layer GTL2 may be disposed on the first gate layer GTL1. The gate auxiliary electrode GAE may be connected to the scan line SLk of the corresponding stage. The gate auxiliary electrode GAE may be connected to the scan line SLk of the corresponding stage through the fifth contact hole CNT5. The fifth contact hole CNT5 may not overlap the active area ACT1-1 of the first-first transistor ST1-1, but the present disclosure is not limited. For example, the gate auxiliary electrode GAE may extend from the fifth contact hole CNT5 in a direction perpendicular to the extending direction of the scan line SLk, and may be bent toward the drain electrode D1-1 of the first-first transistor ST1-1 or the source electrode S1-2 of the first-second transistor ST1-2. The gate auxiliary electrode GAE may have a "L" shape, but the shape thereof is not limited.

At least a part of the gate auxiliary electrode GAE may be disposed between the active area ACT1-1 of the first-first transistor ST1-1 and the active area ACT1-2 of the first-second transistor ST1-2 in the second gate layer GTL2. The gate auxiliary electrode GAE may overlap the source electrode or drain electrode disposed between the active area ACT1-1 of the first-first transistor ST1-1 and the active area ACT1-2 of the first-second transistor ST1-2 in the thickness direction (Z-axis direction). For example, when the drain electrode D1-1 of the first-first transistor ST1-1 is in direct contact with the source electrode S1-2 of the first-second transistor ST1-2, the gate auxiliary electrode GAE may overlap at least one of the drain electrode D1-1 of the first-first transistor ST1-1 and the source electrode S1-2 of the first-second transistor ST1-2 in the thickness direction (Z-axis direction). Therefore, an electric field may be formed between the gate auxiliary electrode GAE and the drain electrode D1-1 of first-first transistor ST1-1 or between the gate auxiliary electrode GAE and the source electrode S1-2 of the first-second transistor ST1-2.

The intensity of the electric field may proportional to a potential difference between electrodes, and may be inversely proportional to a distance between the electrodes. For example, the distance TGI2 between the gate auxiliary electrode GAE and the drain electrode D1-1 of the first-first transistor ST1-1 may be longer than the distance TGI1 between the gate electrode G1-1 and the drain electrode D1-1 of the first-first transistor ST1-1. The intensity of the electric field between the gate auxiliary electrode GAE and the drain electrode D1-1 of the first-first transistor ST1-1 may be lower than the intensity of the electric field between the gate electrode G1-1 and the drain electrode D1-1 of the first-first transistor ST1-1. Therefore, as the gate auxiliary electrode GAE is connected to the scan line SLk of the corresponding stage, the electric field between the gate auxiliary electrode GAE and the drain electrode D1-1 of the first-first transistor ST1-1 may be reduced, and the electric field formed at the node between the first-first transistor ST1-1 and the first-second transistor ST1-2 may be reduced.

As the electric field formed at the node between the first-first transistor ST1-1 and the first-second transistor ST1-2 is reduced, the leakage current flowing through the first-first transistor ST1-1 and the first-second transistor ST1-2 may be reduced, and the drop in luminance of sub-pixels SP may be prevented.

According to a display device of embodiments, the display device may include a gate auxiliary electrode overlapping a floating source/drain node of a dual transistor disposed between a source electrode and a gate electrode of a driving transistor and connected to a gate electrode of at least one transistor of the dual transistor. Therefore, the display device may reduce an electric field formed at the floating source/drain node, and may reduce the leakage current flowing through the dual transistor, thereby preventing the drop in luminance of sub-pixels.

According to a display device of embodiments, at least one transistor of the dual transistor may further include a doped area disposed between an active area and a source/drain electrode. The doping concentration of the doped area may be higher than the doping concentration of the active area, and may be lower than the doping concentration of the source/drain electrode. Therefore, the display device may reduced an electric field formed at the floating source/drain node, and may reduce the leakage current flowing through the dual transistor, thereby preventing the drop in luminance of sub-pixels.

The effects of the present disclosure are not limited by the foregoing, and other various effects are anticipated herein.

Although the preferred embodiments of the present disclosure have been disclosed for illustrative purposes, those skilled in the art will appreciate that various modifications, additions and substitutions are possible, without departing from the scope and spirit of the present disclosure as disclosed in the accompanying claims.

What is claimed is:

1. A display device, comprising:
a substrate; and
a plurality of sub-pixels disposed on the substrate and including a light emitting element and a sub-pixel circuit which drives the light emitting element,
wherein the sub-pixel circuit comprises:
a driving transistor controlling a driving current flowing through the light emitting element;
a first transistor and a second transistor connected in series and disposed between a first node, which is a drain electrode of the driving transistor, and a second node, which is a gate electrode of the driving transistor, to receive a same scan signal from a same scan line; and
a gate auxiliary electrode disposed on a gate electrode of the first transistor or the second transistor and connected to the gate electrode of the first transistor or the second transistor through a contact hole, and
wherein the gate auxiliary electrode overlaps an active area of the first transistor, but does not overlap an active area of the second transistor.

2. The display device of claim 1,
wherein the gate auxiliary electrode overlaps a drain electrode of the first transistor or a source electrode of the second transistor disposed between an active area of the first transistor and an active area of the second transistor in a thickness direction.

3. The display device of claim 1, further comprising:
an active layer disposed on the substrate; and
a first gate layer disposed on the active layer,
wherein an active area of each of the driving transistor, the first transistor, and the second transistor is disposed in the active layer, and
a gate electrode of each of the driving transistor, the first transistor, and the second transistor is disposed in the first gate layer.

4. The display device of claim 3, further comprising:
a second gate layer disposed on the first gate layer,
wherein the gate auxiliary electrode is disposed in the second gate layer.

5. The display device of claim 4, further comprising:
a gate insulating film insulating the gate electrode of each of the first and second transistors and the active area of each of the first and second transistors; and
an interlayer insulating film disposed between the first gate layer and the second gate layer and including the contact hole,
wherein the gate auxiliary electrode is connected to the gate electrode of the first transistor or the second transistor through the contact hole of the interlayer insulating film.

6. The display device of claim 1,
wherein the first transistor includes a source electrode connected to the first node and a drain electrode connected to the second transistor, and
the second transistor includes a source electrode connected to the drain electrode of the first transistor and a drain electrode connected to the second node.

7. The display device of claim 6,
wherein the gate auxiliary electrode overlaps the drain electrode of the first transistor or the source electrode of the second transistor in a thickness direction.

8. The display device of claim 6,
wherein the first transistor further includes a first doped area disposed between the active area of the first transistor and the source electrode of the first transistor, and a second doped area disposed between the active area of the first transistor and the drain electrode of the first transistor, and
the second transistor further includes a third doped area disposed between the active Innovation Counsel LLP area of the second transistor and the source electrode of the second transistor, and a fourth doped area disposed between the active area of the second transistor and the drain electrode of the second transistor.

9. The display device of claim 8,
wherein doping concentration of each of the first, second, third, and fourth doped areas is higher than doping concentration of the active area of the first transistor or the second transistor.

10. The display device of claim 8,
wherein doping concentration of each of the first, second, third, and fourth doped areas is lower than doping concentration of each of the source electrode and drain electrode of the first transistor and the source electrode and drain electrode of the second transistor.

11. The display device of claim 8,
wherein the gate auxiliary electrode overlaps the second doped area of the first transistor or the third doped area of the second transistor in a thickness direction.

12. The display device of claim 8,
wherein the gate auxiliary electrode overlaps at least one of the second doped area and drain electrode of the first transistor and the third doped area and source electrode of the second transistor in a thickness direction.

13. The display device of claim 1,
wherein the sub-pixel circuit further comprises a third transistor selectively supplying a data voltage to a third node which is a source electrode of the driving transistor,
wherein the first, second, and third transistors receive the same scan signal.

14. A display device, comprising:
a substrate; and
a plurality of sub-pixels disposed on the substrate and including an light emitting element and a sub-pixel circuit which drives the light emitting element,
wherein the sub-pixel circuit comprises:
a driving transistor controlling a driving current flowing through the light emitting element;
a first transistor including a first electrode connected to a first node, which is a drain electrode of the driving transistor, and a second electrode selectively connected to a second node, which is a gate electrode of the driving transistor;
a second transistor including a first electrode connected to the second electrode of the first transistor and a second electrode connected to the second node; and
a gate auxiliary electrode disposed on a gate electrode of the first transistor or the second transistor and overlapping the second electrode of the first transistor or the first electrode of the second transistor in a thickness direction,
wherein the gate auxiliary electrode is electrically connected to the gate electrode of the first transistor through a contact hole, the gate auxiliary electrode does not overlap the gate electrode of the second transistor.

15. The display device of claim 14, further comprising:
an active layer disposed on the substrate; and
a first gate layer disposed on the active layer,
wherein an active area of each of the driving transistor, the first transistor, and the second transistor is disposed in the active layer, and
a gate electrode of each of the driving transistor, the first transistor, and the second transistor is disposed in the first gate layer.

16. The display device of claim 15, further comprising:
a second gate layer disposed on the first gate layer,
wherein the gate auxiliary electrode is disposed in the second gate layer.

17. The display device of claim 16, further comprising:
a gate insulating film insulating the gate electrode of each of the first and second transistors and the active area of each of the first and second transistors; and
an interlayer insulating film disposed between the first gate layer and the second gate layer and including the contact hole,
wherein the gate auxiliary electrode is connected to the gate electrode of the first transistor or the second transistor through the contact hole of the interlayer insulating film.

18. The display device of claim 14,
wherein the first transistor further includes a first doped area disposed between the active area of the first transistor and the first electrode of the first transistor, and a second doped area disposed between the active area of the first transistor and the second electrode of the first transistor, and
the second transistor further includes a third doped area disposed between the active area of the second transistor and the first electrode of the second transistor, and a fourth doped area disposed between the active area of the second transistor and the second electrode of the second transistor.

19. The display device of claim 18,
wherein the gate auxiliary electrode overlaps the second doped area of the first transistor or the third doped area of the second transistor in a thickness direction.

20. Display device of claim 18,
wherein the gate auxiliary electrode overlaps at least one of the second doped area and second electrode of the first transistor and the third doped area and first electrode of the second transistor in a thickness direction.

* * * * *